United States Patent
Woo et al.

(10) Patent No.: US 12,119,564 B2
(45) Date of Patent: Oct. 15, 2024

(54) ANTENNA MODULE AND ELECTRONIC DEVICE COMPRISING SAME

(71) Applicant: LG ELECTRONICS INC., Seoul (KR)

(72) Inventors: Seungmin Woo, Seoul (KR); Yusuhk Suh, Seoul (KR); Dongik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/293,173

(22) PCT Filed: Jul. 29, 2021

(86) PCT No.: PCT/KR2021/009935
§ 371 (c)(1),
(2) Date: Jan. 29, 2024

(87) PCT Pub. No.: WO2023/008618
PCT Pub. Date: Feb. 2, 2023

(65) Prior Publication Data
US 2024/0266738 A1    Aug. 8, 2024

(51) Int. Cl.
*H01Q 5/50* (2015.01)
*H01Q 9/04* (2006.01)
*H05K 1/02* (2006.01)
*H05K 1/11* (2006.01)

(52) U.S. Cl.
CPC ............. *H01Q 5/50* (2015.01); *H01Q 9/0414* (2013.01); *H05K 1/0243* (2013.01); *H05K 1/115* (2013.01)

(58) Field of Classification Search
CPC .......... H01Q 5/50; H01Q 9/04; H01Q 9/0414; H01Q 1/46; H05K 1/0243; H05K 1/115
See application file for complete search history.

(56) References Cited

U.S. PATENT DOCUMENTS

2014/0145883 A1    5/2014   Baks et al.

FOREIGN PATENT DOCUMENTS

| KR | 10-2015-0041054 | 4/2015 | |
|---|---|---|---|
| KR | 10-2019-0062022 | 6/2019 | |
| KR | 10-2020-0076379 | 6/2020 | |
| KR | 10-2021-0009531 | 1/2021 | |
| WO | WO-2021019899 A1 * | 2/2021 | ............... H01Q 4/40 |

OTHER PUBLICATIONS

PCT International Application No. PCT/KR2021/009935, International Search Report dated Apr. 21, 2022, 4 pages.

* cited by examiner

*Primary Examiner* — Hoang V Nguyen
(74) *Attorney, Agent, or Firm* — LEE, HONG, DEGERMAN, KANG & WAIMEY

(57) ABSTRACT

Provided is an antenna module produced into a multi-layer substrate. The antenna module comprises: a first radiator disposed on an inner area or an upper area of the multi-layer substrate and formed into a first conductive layer to radiate a radio signal; a second radiator disposed in a lower area of the first radiator to be offset from the center of the first radiator, and formed into a second conductive layer to radiate a radio signal; and a feed line connected to the second radiator by means of a signal via, wherein the first radiator and the second radiator overlap on one axis, and the length of the first radiator on one axis and the length of the second radiator on one axis may differ from each other.

14 Claims, 24 Drawing Sheets

(a)

(b)

(a)

(b)

(a)

(b)

(a)

(b)

(a)

(b)

(a)

(b)

(c)

ANTENNA MODULE AND ELECTRONIC DEVICE COMPRISING SAME

CROSS-REFERENCE TO RELATED APPLICATION

This application is the National Stage filing under 35 U.S.C. 371 of International Application No. PCT/KR2021/009935, filed on Jul. 29, 2021, the contents of which are hereby incorporated by reference herein its entirety.

TECHNICAL FIELD

The present disclosure relates to an antenna module and an electronic device including the same. One particular implementation relates to an antenna module implemented on a multi-layered substrate and an electronic device including the same.

BACKGROUND ART

As functions of electronic devices diversify, the electronic devices can be implemented as image display devices such as multimedia players having complex functions, for example, playing music or video files, playing games, receiving broadcasts, and the like.

An image display device is a device for reproducing (playing) image contents. Image display devices receive images (videos) from various sources and reproduce the received images. Image display devices are implemented as various devices such as PCs (Personal Computers), smart phones, tablet PCs, laptop computers, TV sets, and the like. An image display device such as a smart TV may provide an application for providing web contents, such as web browsers.

The electronic device such as the image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

In this regard, an array antenna that can operate in a millimeter wave (mmWave) band may be mounted in an antenna module. However, an antenna disposed in the antenna module and an electronic component such as a transceiver circuit are electrically connected to each other. To this end, the transceiver circuit may be operably coupled to the antenna module and the antenna module may be configured in the form of a multi-layered substrate.

In the antenna module in the form of the multi-layered substrate, when antenna elements are disposed on a single layer, bandwidths of the antenna elements are limited. On the other hand, when a plurality of antenna elements are stacked on different layers, a coupling change between the antenna elements may sensitively react with a frequency change.

DISCLOSURE OF INVENTION

Technical Problem

The present disclosure is directed to solving the aforementioned problems and other drawbacks. Another aspect of the present disclosure is to provide a broadband antenna module operating in a millimeter wave (mmWave) band and an electronic device including the same.

Still another aspect of the present disclosure is to improve an antenna gain by enhancing efficiency of antenna elements operating in an mmWave band.

Still another aspect of the present disclosure is to reduce an interference level, upon implementing dual polarization antennas, by reducing a current component of an antenna element operating in an mmWave band in an undesired direction.

Still another aspect of the present disclosure is to optimize antenna performance when an RFIC and an antenna element are connected through a feed line inside a PCB as a multi-layered substrate.

Solution to Problem

To achieve those aspects and other advantages of the present disclosure, there is provided an antenna module implemented in a form of a multi-layered substrate. The antenna module may include: a first radiator disposed on an inner region or upper region of the multi-layered substrate and configured as a first conductive layer to radiate a wireless signal; a second radiator disposed on a lower region of the first radiator to be offset from a center of the first radiator, and configured as a second conductive layer to radiate a wireless signal; and a feed line configured to be connected to the second radiator through a signal via. The first radiator and the second radiator may be disposed to overlap each other on one axis, and a length of the first radiator on the one axis and a length of the second radiator on the one axis may be different from each other. The first radiator and the second radiator may operate at different frequency bands.

In an embodiment, the first radiator and the second radiator may be implemented as a first patch antenna and a second patch antenna disposed on different dielectric layers, and the second patch antenna may be connected to the feed line through the signal via. The signal via may be connected to the second patch antenna at a point offset on the one axis from a center of the second patch antenna.

A ratio (b/a) of a length a of the first patch antenna on the one axis to a length b of the second patch antenna on the one axis may be set in the range of 0.35 to 0.9, and a ratio c/b of the length b of the second patch antenna on the one axis to an overlapped length c between the first and second patch antennas may be set in a range less than 0.7.

In an embodiment, the signal via may be connected to the second patch antenna at a point offset on the one axis from a center of the second patch antenna.

In an embodiment, a slot region may be defined in a ground layer such that a first pad of a plurality of pads of the signal via is disposed on the same layer as the ground layer, and the signal via may be vertically connected to the feed line beneath the ground layer through the slot region.

In an embodiment, the antenna module may further include a second lower conductive layer disposed on the same layer as the feed line by being spaced apart from one end portion and another end portion of the feed line by predetermined distances. One end portion of the second lower conductive layer spaced apart from the one end portion of the feed line may be an inner point of a lower region of the second patch antenna.

In an embodiment, the antenna module may further a third lower conductive layer disposed beneath the feed line. The third lower conductive layer may include a third slot region, from which a conductive layer is removed, in a region corresponding to a lower region of the second patch antenna, and a length of the third slot region in the one axis may be longer than a length of each of the plurality of pads of the signal via in the one axis.

An embodiment, the antenna module may further include a ground via wall configured as a plurality of pads on an upper portion of the ground layer, and the ground via wall may include a first ground via wall and a second ground via wall disposed at both sides on the one axis of the multi-layered substrate.

In an embodiment, the ground via wall may include vertical connection portions and a plurality of pads, and at least one adjacent pad of the plurality of pads of the ground via wall may be connected by the vertical connection portion.

In an embodiment, a radio d/b of the length b of the second patch antenna on the one axis to a length d from one end portion of the second patch antenna to a connected point of the feed line may be set in the range of 0.5 to 1.

In an embodiment, a ratio e/f of a vertical distance f between the first patch antenna and a ground layer above the feed line to a vertical distance e between the first patch antenna and the second patch antenna may be set in the range of 0.1 to 0.5.

In an embodiment, a distance g from a connected point of the feed line to the second ground via wall may be set to be equal to or less than 0.25 times of a wavelength corresponding to an operating frequency of an antenna element by the first and second patch antennas.

In an embodiment, the first patch antenna may be configured as a square patch antenna having a first length and a first width, and the second patch antenna may be configured as a square patch antenna having a second length and a second width. The first patch antenna and the second patch antenna may be disposed to overlap each other by a third length in a lengthwise direction.

In an embodiment, the first patch antenna may be configured as a circular patch antenna having a first diameter, the second patch antenna may be configured as a circular patch antenna having a second diameter. The first patch antenna and the second patch antenna may be disposed on an arcuate region overlapped by a fourth length in one axial direction.

In an embodiment, the second patch antenna may be connected to the feed line through the signal via at a first point offset in one axial direction. The antenna module may further include a third patch antenna connected to a second feed line through a second signal via at a second point offset in another axial direction orthogonal to the one axial direction. The second patch antenna and the third patch antenna may be disposed in the one axial direction and the another axial direction on the same layer of the multi-layered substrate.

In an embodiment, the antenna module may further include a transceiver circuit disposed on the antenna module configured as the multi-layered substrate. The transceiver circuit may be disposed beneath the multi-layered substrate and electrically connected to the multi-layered substrate through a plurality of connection terminals, and one of the plurality of connection terminals. The lower signal via may be vertically connected to another end portion of the feed line through a plurality of pads and vertical connection portions.

According to another aspect of the present disclosure, there is provided an electronic device having an antenna module. The electronic device may include: a transceiver circuit disposed on the antenna module configured as a multi-layered substrate; a main printed circuit board (PCB) disposed inside the electronic device to be operably coupled to the multi-layered substrate; and an antenna module provided with a first radiator disposed on an inner region or upper region of the multi-layered substrate and configured as a first conductive layer to radiate a wireless signal, and a second radiator disposed on a lower region of the first radiator to be offset from a center of the first radiator, and configured as a second conductive layer to radiate a wireless signal.

In an embodiment, the first radiator and the second radiator may be implemented as a first patch antenna and a second patch antenna disposed on different dielectric layers. The second patch antenna may be connected to a feed line through a signal via. The signal via may be connected to the second patch antenna at a point offset on one axis from a center of the second patch antenna.

A ratio (b/a) of a length a of the first patch antenna on the one axis to a length b of the second patch antenna on the one axis may be set in a range of 0.35 to 0.9, and a ratio c/b of the length b of the second patch antenna on the on axis to an overlapped length c between the first and second patch antennas may be set in a range less than 0.7.

In an embodiment, the antenna module may further include a feed line configured to be connected to the second patch antenna through the signal via. The first radiator and the second radiator may be disposed to overlap each other on the one axis, and a length of the first radiator on the one axis and a length of the second radiator on the one axis may be different from each other, such that the first radiator and the second radiator operate at different frequency bands.

In an embodiment, a slot region may be defined in a ground layer such that a first pad of a plurality of pads of the signal via is disposed on the same layer as the ground layer. The signal via may be vertically connected to the feed line beneath the ground layer through the slot region.

In an embodiment, the antenna module may further include: a second lower conductive layer disposed on the same layer as the feed line by being spaced apart from one end portion and another end portion of the feed line by predetermined distances; and a third lower conductive layer disposed beneath the feed line. One end portion of the second lower conductive layer spaced apart from the one end portion of the feed line may be an inner position of a lower region of the second patch antenna. The third lower conductive layer may include a third slot region, from which a conductive layer is removed, in a region corresponding to the lower region of the second patch antenna. A length of the third slot region in one axis may be longer than a length of each of the plurality of pads of the signal via in the one axis.

In an embodiment, a slot region may be defined in a ground layer such that a first pad of a plurality of pads of the signal via is disposed on the same layer as the ground layer, and the signal via may be vertically connected to the feed line beneath the ground layer through the slot region.

In an embodiment, the antenna module may further include a second lower conductive layer disposed on the same layer as the feed line by being spaced apart from one end portion and another end portion of the feed line by predetermined distances, and a third lower conductive layer disposed beneath the feed line.

In an embodiment, the third lower conductive layer may include a third slot region, from which a conductive layer is removed, in a region corresponding to the lower region of the second patch antenna, and a length of the third slot region in one axis may be longer than a length of each of the plurality of pads of the signal via in the one axis.

In an embodiment, the antenna module may be configured as an array antenna having antenna elements each including the first radiator and the second radiator. A processor disposed on the main PCB may control the transceiver circuit such that the array antenna radiates a wireless signal to another electronic device.

In an embodiment, the processor may control the transceiver circuit to perform wireless communication using a first wireless signal of a first band, radiated through the first radiator of the array antenna. The processor may control the transceiver circuit to perform wireless communication using a second wireless signal of a second band, radiated through the second radiator of the array antenna, when the first wireless signal has a quality equal to or lower than a threshold value. The transceiver circuit may apply the second wireless signal of the second band to the array antenna through the feed line.

Advantageous Effects of Invention

Hereinafter, technical effects of a broadband antenna module operating in a millimeter wave (mmWave) band and an electronic device having the same will be described.

According to an embodiment, a broadband antenna module operating in a millimeter wave (mmWave) band by operating a plurality of stacked radiators in an independent manner, and an electronic device having the same can be provided.

According to an embodiment, efficiency of an antenna element that operates in an mmWave band can be improved and an antenna gain can be increased by applying an offset feed structure to a lower radiator.

According to an embodiment, efficiency of an antenna element that operates in an mmWave band can be improved and an antenna gain can be increased by disposing an open space such as a slot region below a feed line.

According to an embodiment, a current component, which is generated in an antenna element operating in an mmWave band in an undesired direction, can be reduced by applying an offset feed structure to a lower radiator.

According to an embodiment, an interference level can be lowered, when implementing a dual polarization antenna, by applying an offset feed structure to a lower radiator.

According to an embodiment, when an RFIC and an antenna element are connected in a PCB as a multi-layered substrate through a feed line, a shape of a feed via structure and a connected point thereof can be optimized, thereby enhancing antenna performance as high as possible.

Further scope of applicability of the present disclosure will become apparent from the following detailed description. It should be understood, however, that the detailed description and specific examples, such as the preferred embodiments of the present disclosure, are given by way of illustration only, since various modifications and alternations within the spirit and scope of the disclosure will be apparent to those skilled in the art.

MODE FOR THE INVENTION

Figure 1:
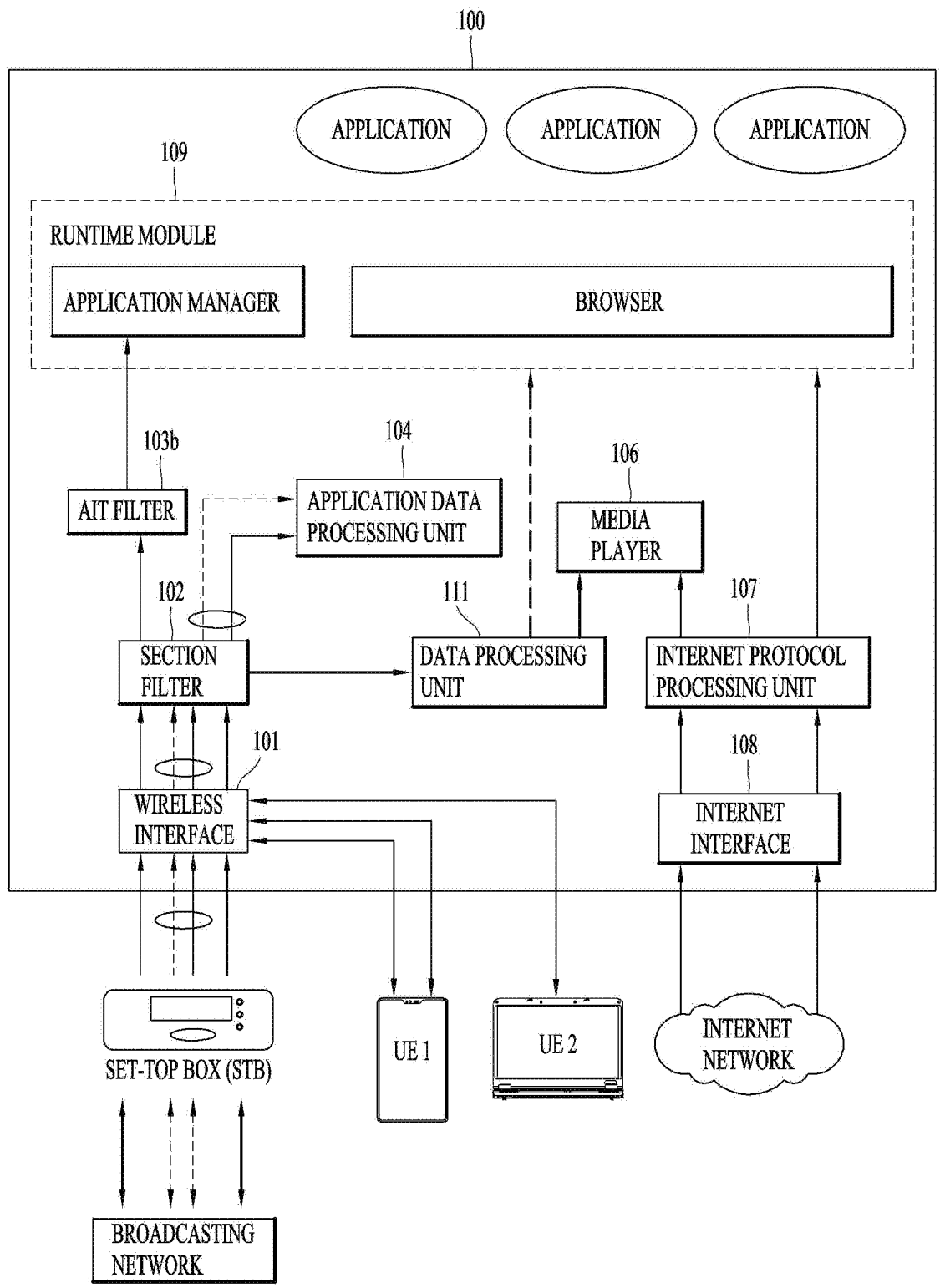
FIG. 1 is a diagram schematically illustrating an example of a whole wireless AV system including an image display device according to one embodiment of the present disclosure.

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. A suffix "module" or "unit" used for elements disclosed in the following description is merely intended for easy description of the specification, and the suffix itself is not intended to give any special meaning or function. In describing the embodiments disclosed herein, moreover, the detailed description will be omitted when specific description for publicly known technologies to which the invention pertains is judged to obscure the gist of the present disclosure. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Electronic devices presented herein may be implemented using a variety of different types of terminals. Examples of such devices include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signages, and the like.

FIG. 1 is a diagram schematically illustrating an example of an entire wireless AV system including an image display device according to one embodiment of the present disclosure.

As illustrated in FIG. 1, an image display device 100 according to one embodiment of the present disclosure is connected to the wireless AV system (or a broadcasting network) and an Internet network. The image display device 100 may be, for example, a network TV, a smart TV, a hybrid broadcast broadband TV (HBBTV), or the like.

The image display device 100 may be wirelessly connected to the wireless AV system (or the broadcasting network) via a wireless interface or wirelessly or wiredly connected to the Internet network via an Internet interface. In relation to this, the image display device 100 may be configured to be connected to a server or another electronic device via a wireless communication system. As an example, the image display device 100 needs to provide an 802.11ay communication service operating in a millimeter wave (mmWave) band to transmit or receive large-capacity data at a high speed.

The mmWave band may be any frequency band in a range of 10 GHz to 300 GHz. In this disclosure, the mmWave band may include an 802.11ay band of a 60 GHz band. In addition, the mmWave band may include a 5G frequency band of a 28 GHz band or the 802.11ay band of the 60 GHz band. The 5G frequency band may be set to about 24 to 43 GHz band and the 802.11ay band may be set to 57 to 70 GHz or 57 to 63 GHz band, but are not limited thereto.

The image display device 100 may wirelessly transmit or receive data to/from an electronic device in a periphery of the image display device 100, e.g., a set-top box or another electronic device via the wireless interface. As an example, the image display device 100 may transmit or receive wireless AV data to/from a set-top box or another electronic device, e.g., a mobile terminal arranged in front of or below the image display device 100.

The image display device 100 includes, for example, a wireless interface 101*b*, a section filter 102*b*, an application information table (AIT) filter 103*b*, an application data processing unit 104*b*, a data processing unit 111*b*, a media player 106*b*, an Internet protocol processing unit 107*b*, an Internet interface 108*b*, and a runtime module 109*b*.

Through a broadcast interface that is the wireless interface 101*b*, AIT data, real-time broadcast content, application data, and a stream event are received. The real-time broadcast content may be referred to as linear audio/video (A/V) content.

The section filter 102b performs section filtering on four types of data received through the wireless interface 101b to transmit the AIT data to the AIT filter 103b, the linear A/V content to the data processing unit 111b, and the stream events and the application data to the application data processing unit 104b.

Non-linear A/V content and the application data are received through the Internet interface 108b. The non-linear A/V content may be, for example, a content on demand (COD) application. The non-linear A/V content is transmitted to the media player 106b, and the application data is transmitted to the runtime module 109b.

Further, the runtime module 109b includes, for example, an application manager and a browser as illustrated in FIG. 1. The application manager controls a life cycle of an interactive application using, for example, the AIT data. In addition, the browser performs, for example, a function of displaying and processing the interactive application.

Hereinafter, a communication module having an antenna for providing a wireless interface in an electronic device such as the above-described image display device will be described in detail. In relation to this, the wireless interface for communication between electronic devices may be a WiFi wireless interface, but is not limited thereto. As an example, a wireless interface supporting the 802.11ay standard may be provided for high-speed data transmission between electronic devices.

The 802.11ay standard is a successor standard for raising a throughput for the 802.11ad standard to 20 Gbps or greater. An electronic device supporting an 802.11ay wireless interface may be configured to use a frequency band of about 57 to 64 GHz. The 802.11ay wireless interface may be configured to provide backward compatibility for an 802.11ad wireless interface. The electronic device providing the 802.11ay wireless interface may be configured to provide coexistence with a legacy device using the same band.

In relation to a wireless environment for the 802.11ay standard, it may be configured to provide a coverage of 10 meters or longer in an indoor environment, and 100 meters or longer in an outdoor environment with a line of sight (LOS) channel condition.

The electronic device supporting the 802.11ay wireless interface may be configured to provide visual reality (VR) headset connectivity, support server backups, and support cloud applications that require low latency.

An ultra-short range (USR) communication scenario, i.e., a near field communication scenario which is a use case of the 802.11ay wireless interface, is a model for fast large-capacity data exchange between two terminals. The USR communication scenario may be configured to require low power consumption of less than 400 mW, while providing a fast link setup within 100 msec, transaction time within 1 second, and a 10 Gbps data rate at a very close distance of less than 10 cm.

As the use case of the 802.11ay wireless interface, the 8K UHD Wireless Transfer at Smart Home Usage Model may be taken into account. In the Smart Home Usage Model, a wireless interface between a source device and a sync device may be taken into consideration to stream 8K UHD content at home. In relation to this, the source device may be one of a set-top box, a Blue-ray player, a tablet PC, and a smart phone and the sink device may be one of a smart TV and a display device, but are not limited thereto. In relation to this, the wireless interface may be configured to transmit uncompressed 8K UHD streaming data (60 fps, 24 bits per pixel, at least 4:2:2) with a coverage of less than 5 m between the source device and the sink device. To do so, the wireless interface may be configured such that data is transmitted between electronic devices at a speed of at least 28 Gbps.

In order to provide such a wireless interface, embodiments related to an array antenna operating in an mmWave band and an electronic device including the array antenna will be described with reference to the accompanying drawings. It will be apparent to those skilled in the art that the present disclosure may be embodied in other specific forms without departing from the spirit or essential characteristics thereof.

Figure 2:
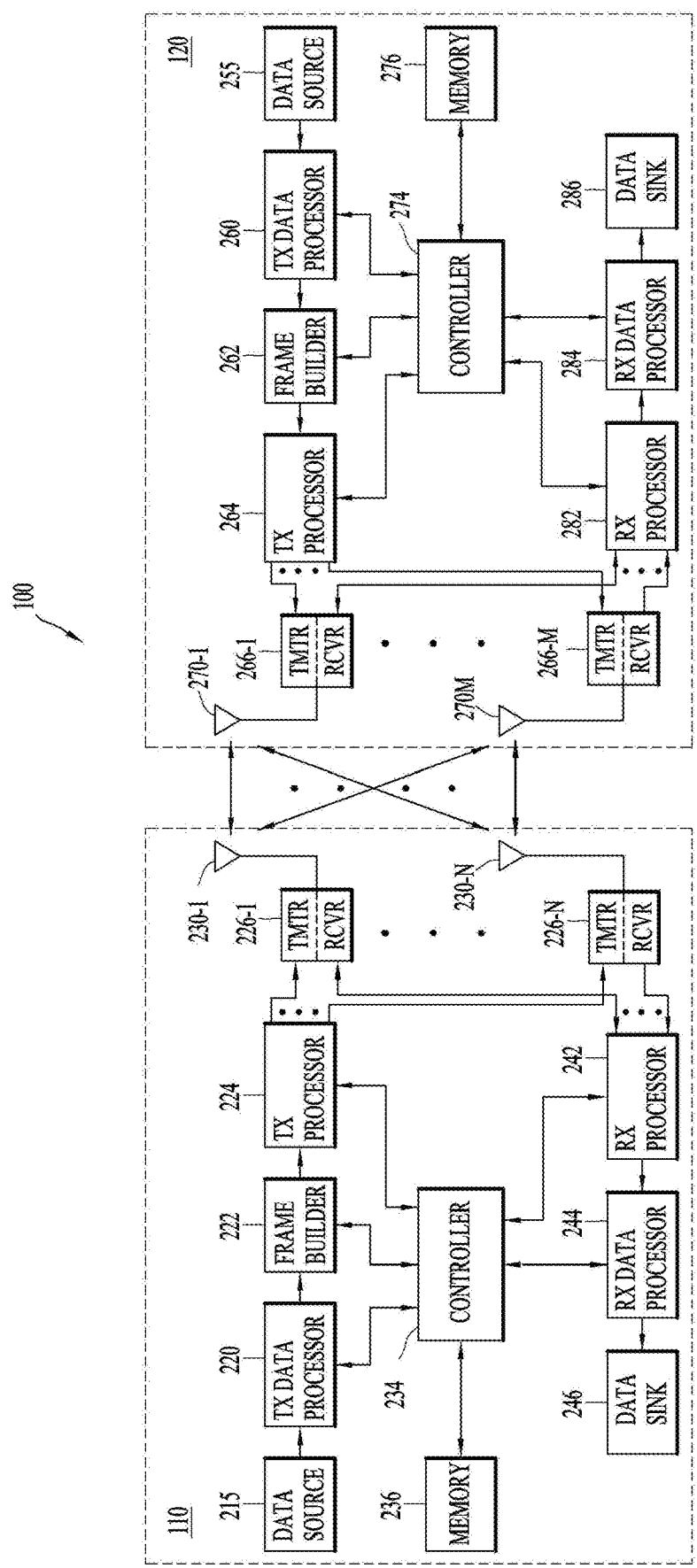
FIG. 2 illustrates a detailed configuration of electronic devices configured to support wireless interfaces according to the present disclosure.

FIG. 2 illustrates a detailed configuration of electronic devices configured to support wireless interfaces according to the present disclosure. FIG. 2 illustrates a block diagram of an access point 110 (generally, a first wireless node) and an access terminal 120 (generally, a second wireless node) in a wireless communication system. The access point 110 is a transmitting entity for downlink transmission and a receiving entity for uplink transmission. The access terminal 120 is a transmitting entity for uplink transmission and a receiving entity for downlink transmission. As used herein, the "transmitting entity" is an independently operating apparatus or device capable of transmitting data through a wireless channel, and the "receiving entity" is an independently operating apparatus or device capable of receiving data through a wireless channel.

Referring to FIGS. 1 and 2, the set-top box (STB) of FIG. 1 may be the access point 110, and an electronic device, that is, the image display device 100 of FIG. 1 may be the access terminal 120, but are not limited thereto. Accordingly, it should be understood that the access point 110 may alternatively be an access terminal, and the access terminal 120 may alternatively be an access point.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

During operation, the TX data processor 220 receives data (e.g., data bits) from a data source 215, and processes the data for transmission. For example, the TX data processor 220 may encode data (e.g., data bits) into encoded data, and modulate the encoded data into data symbols. The TX data processor 220 may support different modulation and coding schemes (MCSs). For example, the TX data processor 220 may encode data at any one of a plurality of different coding rates (e.g., using low-density parity check (LDPC) encoding). In addition, the TX data processor 220 may modulate the encoded data using any one of a plurality of different modulation schemes including, but not limited to, BPSK, QPSK, 16QAM, 64QAM, 64APSK, 128APSK, 256QAM, and 256APSK.

The controller 234 may transmit, to the TX data processor 220, a command for specifying an MCS to be used (e.g., based on channel conditions for downlink transmission). The TX data processor 220 may encode and modulate the data received from the data source 215 according to the specified MCS. It needs to be recognized that the TX data processor 220 may perform additional processing on the data, such as data scrambling and/or other processing. The TX data processor 220 outputs the data symbols to the frame builder 222.

The frame builder 222 constructs a frame (also referred to as a packet) and inserts the data symbols into a data payload of the frame. The frame may include a preamble, a header, and a data payload. The preamble may include a short training field (STF) sequence and a channel estimation (CE) sequence to assist the access terminal 120 in receiving the frame. The header may include information regarding data in a payload, such as a length of the data and an MCS used to encode and modulate the data. Based on this information, the access terminal 120 may demodulate and decode the data. The data in the payload may be partitioned among a plurality of blocks, and each block may contain a part of the data and a guard interval (GI) to assist the receiver in phase tracking. The frame builder 222 outputs the frame to the TX processor 224.

The TX processor 224 processes the frame for transmission on downlink. For example, the TX processor 224 may support different transmission modes, e.g., an orthogonal frequency-division multiplexing (OFDM) transmission mode and a single-carrier (SC) transmission mode. In this example, the controller 234 may transmit, to the TX processor 224, a command for specifying a transmission mode to be used, and the TX processor 224 may process the frame for transmission according to the specified transmission mode. The TX processor 224 may apply a spectrum mask to the frame so that a frequency configuration of a downlink signal complies with particular spectrum requirements.

The TX processor 224 may support multiple-input-multiple-output (MIMO) transmission. In these aspects, the access point 110 may include a plurality of antennas 230-1 to 230-N and a plurality of transceivers 226-1 to 226-N (e.g., one for each antenna). The TX processor 224 may perform spatial processing on incoming frames and provide a plurality of transmission frame streams to a plurality of antennas. The transceivers 226-1 to 226-N receive and process (e.g., convert to analog, amplify, filter, and frequency up-convert) each of the transmission frame streams to generate transmission signals for transmission through the antennas 230-1 to 230-N.

To transmit data, the access terminal 120 includes a TX data processor 260, a frame builder 262, a TX processor 264, a plurality of transceivers 266-1 to 266-M, and a plurality of antennas 270-1 to 270-M (e.g., one antenna per transceiver). The access terminal 120 may transmit data to the access point 110 on uplink and/or transmit the data to another access terminal (e.g., for peer-to-peer communication). The access terminal 120 also includes a controller 274 configured to control operations of the access terminal 120.

The transceivers 266-1 to 266-M receive and process (e.g., convert to analog, amplify, filter, and frequency up-convert) an output from the TX processor 264 for transmission via one or more of the antennas 270-1 to 270-M. For example, the transceiver 266-1 may up-convert the output from the TX processor 264 into a transmission signal having a frequency in a 60 GHz band. Accordingly, the antenna module described herein may be configured to perform a beamforming operation in the 60 GHz band, for example, in a band of about 57 to 63 GHz. In addition, the antenna module may be configured to support MIMO transmission while performing beamforming in the 60 GHz band.

In relation to this, the antennas 270-1 to 270-M and the transceivers 266-1 to 266-M may be implemented in an integrated form on a multi-layer circuit substrate. To do so, among the antennas 270-1 to 270-M, an antenna configured to operate with vertical polarization may be vertically arranged inside the multi-layer circuit substrate.

To receive data, the access point 110 includes a reception (RX) processor 242 and an RX data processor 244. During operation, the transceivers 226-1 to 226-N receive a signal (e.g., from the access terminal 120) and spatially process (e.g., frequency down-convert, amplify, filter, and digitally convert) the received signal.

The RX processor 242 receives outputs from the transceivers 226-1 through 226-N and processes the outputs to recover data symbols. For example, the access point 110 may receive data from a frame (e.g., from the access terminal 120). In this example, the RX processor 242 may detect a start of the frame using a short training field (STF) sequence in a preamble of the frame. The RX processor 242 may also use the STF for automatic gain control (AGC) adjustment. The RX processor 242 may also perform channel estimation (e.g., using a channel estimation (CE) sequence in the preamble of the frame), and perform channel equalization on the received signal based on the channel estimation.

The RX data processor 244 receives data symbols from the RX processor 242 and an indication of a corresponding MSC scheme from the controller 234. The RX data processor 244 demodulates and decodes the data symbols, recovers the data according to the indicated MSC scheme, and stores and/or outputs the recovered data (e.g., data bits) to a data sink 246 for additional processing.

The access terminal 120 may transmit the data using an orthogonal frequency-division multiplexing (OFDM) transmission mode or a single-carrier (SC) transmission mode. In this case, the RX processor 242 may process the received signal according to a selected transmission mode. In addition, as described above, the TX processor 264 may support MIMO transmission. In this case, the access point 110 includes the antennas 230-1 to 230-N and the transceivers 226-1 to 226-N (e.g., one for each antenna). Accordingly, the antenna module described herein may be configured to perform a beamforming operation in the 60 GHz band, for example, in a band of about 57 to 63 GHz. In addition, the antenna module may be configured to support MIMO transmission while performing beamforming in the 60 GHz band.

In relation to this, the antennas 230-1 to 230-M and the transceivers 226-1 to 226-M may be implemented in an integrated form on a multi-layer circuit substrate. To do so, among the antennas 230-1 to 230-M, an antenna configured to operate with vertical polarization may be vertically arranged inside the multi-layer circuit substrate.

Meanwhile, each transceiver receives and processes (e.g., frequency down-converts, amplifies, filters, and digitally converts) a signal from each antenna. The RX processor 242 may perform spatial processing on the outputs from the transceivers 226-1 to 226-N to recover the data symbols.

The access point 110 also includes a memory 236 coupled to the controller 234. The memory 236 may store commands that, when executed by the controller 234, cause the controller 234 to perform one or more of the operations described herein. Similarly, the access terminal 120 also includes a memory 276 coupled to the controller 274. The memory 276 may store commands that, when executed by the controller 274, cause the controller 274 to perform one or more of the operations described herein.

Meanwhile, an electronic device supporting 802.11ay wireless interface according to the present disclosure determines whether or not a communication medium is available to communicate with other electronic devices. To this end, the electronic device transmits a Request to Send (RTS)-

Figure 3A:
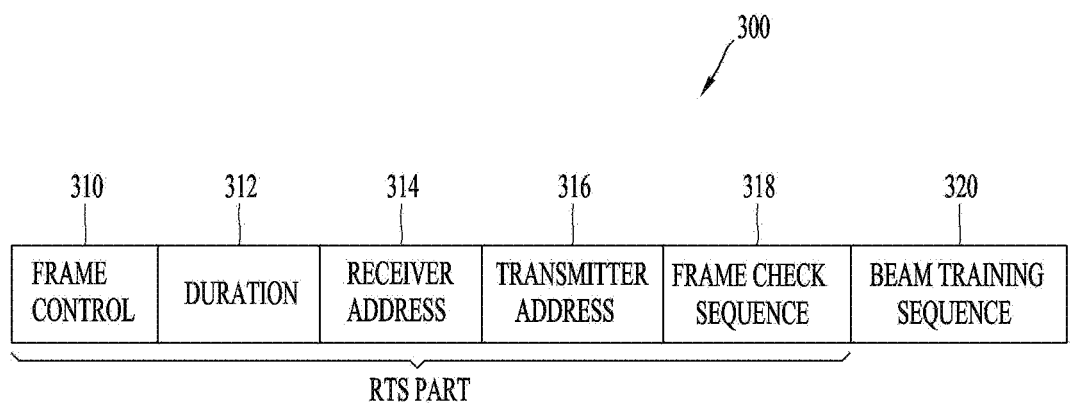
FIG. 3A illustrates a request to send (RTS) and a clear to send (CTS) according to the present disclosure.
Figure 3A:
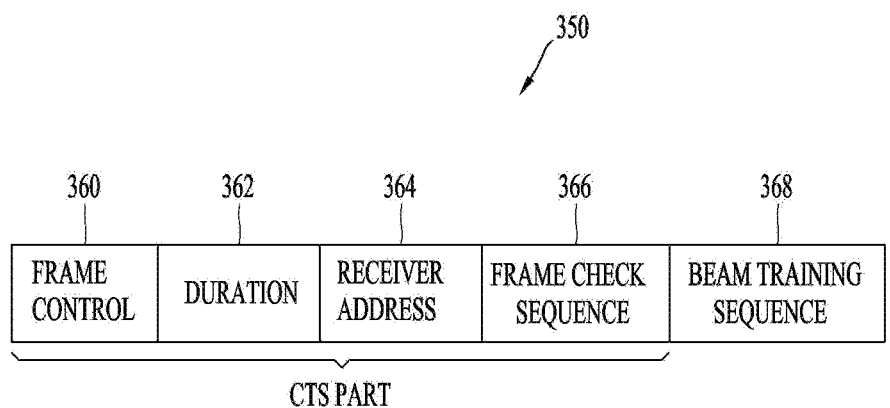

TRN frame including an RTS part and a first beam training sequence. In this regard, FIG. 3A illustrates a Request to Send (RTS) and a Clear to Send (CTS) according to the present disclosure. A transmitting device may use an RTS frame to determine whether a communication medium is available to transmit one or more data frames to a destination device. In response to the reception of the RTS frame, the destination device transmits a CTS frame to the transmitting device when the communication medium is available. In response to the reception of the CTS frame, the transmitting device transmits the one or more data frames to the destination device. In response to the successful reception of the one or more data frames, the destination device transmits one or more acknowledgment ("ACK") frames to the transmitting device.

Referring to (a) of FIG. 3A, a frame 300 includes an RTS part including a frame control field 310, a duration field 312, a receiver address field 314, a transmitter address field 316, and a frame check sequence field 318. For the purpose of improved communication and interference reduction, the frame 300 further includes a beam training sequence field 320 to configure antennas of a destination device and one or more neighboring devices, respectively.

Referring to (b) of FIG. 3A, a CTS frame 350 includes a CTS part including a frame control field 360, a duration field 362, a receiver address field 314, and a frame check sequence field 366. For the purpose of improved communication and interference reduction, the frame 350 further includes a beam training sequence field 368 to configure antennas of a transmitting device and one or more neighboring devices, respectively.

The beam training sequence fields 320 and 368 may comply with the training (TRN) sequence in accordance with IEEE 802.11ad or 802.11ay. The transmitting device may use the beam training sequence field 368 to configure its antenna for directional transmission to the destination device. On the other hand, the transmitting devices may use the beam training sequence field to configure their own antennas to reduce transmission interference at the destination device. In this case, the transmitting devices may use the beam training sequence field to configure their own antennas to generate antenna radiation patterns with nulls aimed at the destination device.

Figure 3B:
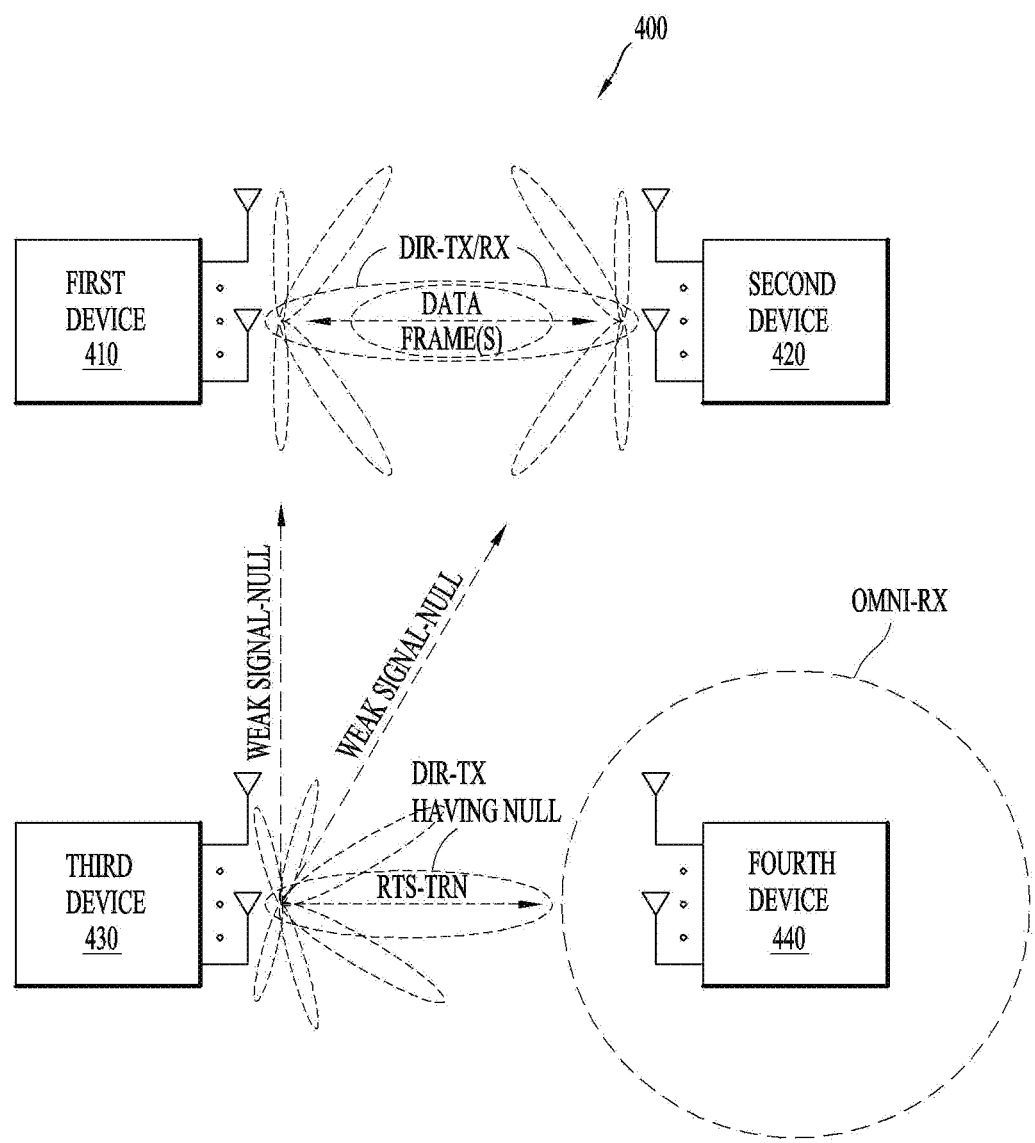
FIG. 3B is a block diagram illustrating a communication system 400 according to an example of the present disclosure.

Therefore, electronic devices supporting 802.11ay wireless interface may form initial beams to have a low interference level therebetween using beamforming patterns determined according to the beam training sequence. In this regard, FIG. 3B is a block diagram illustrating a communication system 400 according to an example of the present disclosure. As illustrated in FIG. 3B, first and second devices 410 and 420 may improve communication performance by matching directions of main beams. On the other hand, the first and second devices 410 and 420 may form signal-null having weak signal intensity in a specific direction, in order to reduce interference with a third device 430.

In relation to the formation of the main beam and the signal-null, a plurality of electronic devices according to the present disclosure may perform beamforming through array antennas. Referring to FIG. 3B, some of the plurality of electronic devices may alternatively be configured to perform communication with an array antenna of another electronic device through a single antenna. In this regard, when performing communication through the single antenna, a beam pattern is formed as an omnidirectional pattern.

Referring to FIG. 3B, the first to third devices 410 to 430 perform beamforming but a fourth device 440 does not perform beamforming, but the present disclosure is not limited thereto. Therefore, it may alternatively be configured such that three of the first to fourth devices 410 to 440 perform beamforming and the other may not perform beamforming.

As another example, it may be configured such that any one of the first to fourth devices 410 to 440 performs beamforming and the remaining three devices do not perform beamforming. As still another example, it may be configured such that two of the first to fourth devices 410 to 440 perform beamforming and the remaining two devices do not perform beamforming. As still another example, all the first to fourth devices 410 to 440 may be configured to perform beamforming.

Referring to FIGS. 3A and 3B, the first device 410 determines that it is an intended receiving device of the CTS-TRN frame 350 on the basis of an address displayed on the receiver address field 364 of the CTS-TRN frame 350. In response to the determination as the intended receiving device of the CTS-TRN frame 350, the first device 410 may use the beam training sequence of the beam training sequence field 368 of the received CTS-TRN 350 to configure its own antenna for a directional transmission substantially and selectively aimed at the second device 420. That is, the antenna of the first device 410 is configured to generate a primary lobe (e.g., highest gain lobe) substantially aimed at the second device 420, and an antenna radiation pattern with non-primary lobes aimed at other directions.

The second device 420 already knows the direction toward the first device 410 based on the beam training sequence of the beam training sequence field 320 of the previously-received RTS-TRN frame 300. Therefore, the second device 420 may configure its own antenna for a directional reception (e.g., primary antenna radiation lobe) selectively aimed at the first device 410. Therefore, while the antenna of the first device 410 is configured for the directional transmission toward the second device 420 and the antenna of the second device 420 is configured for the directional reception from the first device 410, the first device 410 transmits one or more data frames to the second device 420. Accordingly, the first and second devices 410 and 420 perform directional transmission/reception (DIR-TX/RX) of the one or more data frames through the primary lobe (main beam).

On the other hand, the first and second devices 410 and 420 may partially modify the beam pattern of the third device 430 to reduce interference with the third device 430 due to an antenna radiation pattern with the non-primary lobes.

In this regard, the third device 430 determines that it is not an intended receiving device of the CTS-TRN frame 350 on the basis of an address indicated in the receiver address field 364 of the CTS-TRN frame 350. In response to the determination that it is not the intended receiving device of the CTS-TRN frame 350, the third device 430 uses the beam training sequence of the beam training sequence field 368 of the received CTS-TRN 350 and the sequence of the beam training sequence field 320 of the previously-received RTS-TRN frame 300, in order to configure its antenna to generate antenna radiation patterns each with nulls substantially aimed at the second device 420 and the first device 410. The nulls may be based on estimated arrival angles of the previously-received TRS-TRN frame 300 and CTS-TRN frame 350. In general, the third device 430 generates antenna radiation patterns with desired signal power, refusals, or gains aimed at the first device 410 and the second device 420 such that estimated interferences at the devices 410 and 420 are equal to or lower than a defined threshold value (e.g., to achieve a desired bit error rate (BER), signal-to-noise ratio (SNR), signal-to-interference ratio (SINR), and/or other one or more communication attributes).

The third device 430 may configure its antenna transmission radiation pattern by estimating antenna gains in directions toward the first and second devices 410 and 420, estimating antenna mutuality differences (e.g., transmitting antenna gain—receiving antenna gain) between the third device 430 and the first and second devices 410 and 420, and calculating those values over one or more sectors for determining corresponding estimated interferences at the first and second devices 410 and 420.

The third device 430 transmits the RTS-TRN frame 300 intended for the fourth device 440, which the fourth device 440 receives. The third device 430 maintains an antenna configuration with nulls aimed at the first and second devices 410 and 420 as long as the first device 410 and the second device 420 are communicating based on durations displayed on the duration fields 312 and 362 of the RTS-TRN frame 300 and the CTS-TRN frame 350, respectively. As the antenna of the third device 430 is configured to produce the nulls aimed at the first device 410 and the second device 420, the transmission of the RTS-TRN frame 300 by the third device 430 may produce reduced interferences at the first device 410 and the second device 420.

Therefore, electronic devices supporting the 802.11ay wireless interface disclosed herein can form a signal-null to a specific direction for interference reduction while matching a main beam direction therebetween using array antennas. To this end, the plurality of electronic devices may form an initial beam direction through a beam training sequence, and change the beam direction through the periodically updated beam training sequence.

As aforementioned, the beam directions should be matched between the electronic devices for high-speed data communication between the electronic devices. Also, the loss of wireless signals transmitted to an antenna element should be minimized for the high-speed data communication. To this end, the array antenna should be disposed inside a multi-layered substrate on which an RFIC is disposed. Also, the array antenna is necessarily disposed adjacent to a side area inside the multi-layered substrate for radiation efficiency.

In addition, the beam training sequence should be updated to adapt to the change of a wireless environment. To update the beam training sequence, the RFIC should periodically transmit and receive signals to and from a processor such as a modem. Therefore, control signal transmission and reception between the RFIC and the modem should also be carried out within fast time to minimize an update delay time. To this end, a physical length of a connection path between the RFIC and the modem should be reduced. To this end, the modem may be disposed on the multi-layered substrate on which the array antenna and the RFIC are disposed. Or, in the structure that the array antenna and the RFIC are disposed on the multi-layered substrate and the modem is disposed on a main substrate, the connection length between the RFIC and the modem may be minimized. A detailed structure thereof will be described later with reference to FIG. 5C.

Figure 4:
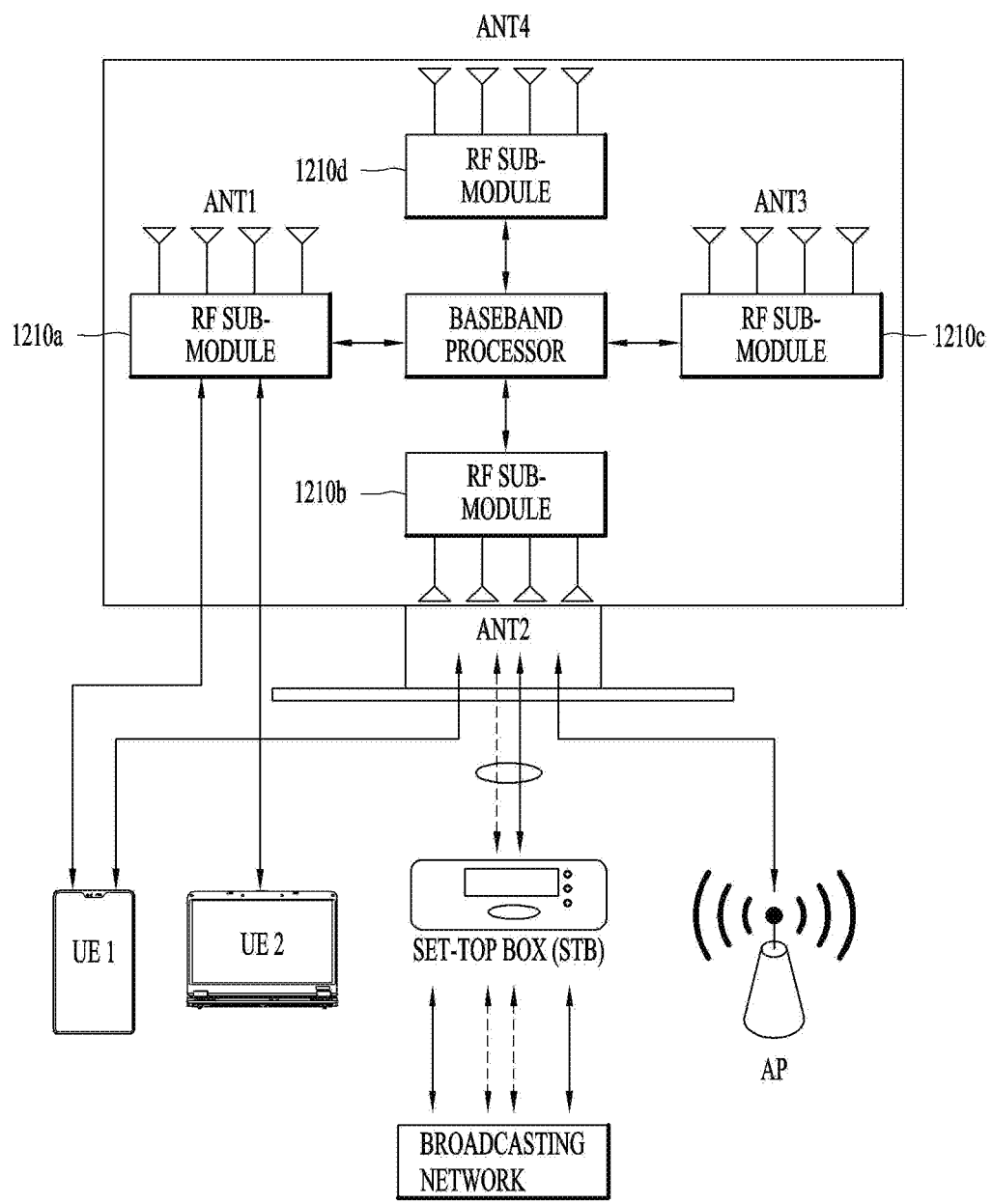
FIG. 4 is a diagram illustrating an electronic device including a plurality of antenna modules and a plurality of transceiver circuit modules in accordance with one embodiment.

Hereinafter, an electronic device having an array antenna that can operate in an mmWave band will be described. In this regard, FIG. 4 is a diagram illustrating an electronic device including a plurality of antenna modules and a plurality of transceiver circuit modules in accordance with one embodiment. Referring to FIG. 4, a home appliance in which a plurality of antenna modules and a plurality of transceiver circuit modules are disposed may be a television, but is not limited thereto. Therefore, the home appliance having the plurality of antenna modules and the plurality of transceiver circuit modules disclosed herein may include an arbitrary home appliance or display device that supports a communication service in a millimeter wave band.

Referring to FIG. 4, the electronic device 1000 includes a plurality of antenna modules ANT1 to ANT4 and a plurality of transceiver circuit modules 1210a to 1210d. In this regard, the plurality of transceiver circuit modules 1210a to 1210d may correspond to the aforementioned transceiver circuit 1250. Or, the plurality of transceiver circuit modules 1210a to 1210d may be a partial configuration of the transceiver circuit 1250 or a partial configuration of a front end module disposed between the antenna module and the transceiver circuit 1250.

The plurality of antenna modules ANT1 to ANT4 may be configured as array antennas with a plurality of antenna elements. The number of elements of each antenna module ANT1 to ANT4 may be two, three, four, and the like as aforementioned, but it not limited thereto. For example, the number of antenna modules ANT1 to ANT4 may be expanded to two, four, eight, sixteen, and the like. Also, the elements of the antenna modules ANT1 to ANT4 may be selected by the same number or different numbers. The plurality of antenna modules ANT1 to ANT4 may be disposed on different areas of the display or on a bottom or side surface of the electronic device. The plurality of antenna modules ANT1 to ANT4 may be disposed on top, left, bottom, and right sides of the display, but the present disclosure is not limited thereto. As another example, the plurality of antenna modules ANT1 to ANT4 may alternatively be disposed on a left top portion, a right top portion, a left bottom portion, and a right bottom portion of the display.

The antenna modules ANT1 to ANT4 may be configured to transmit and receive signals at an arbitrary frequency band in a specific direction. For example, the antenna modules ANT1 to ANT4 may operate at one of 20 GHz band, 39 GHz band, and 64 GHz band.

The electronic device may maintain a connection state with different entities through two or more of the antenna modules ANT1 to ANT4 or perform data transmission or reception therefor. In this regard, the electronic device corresponding to the display device may transmit or receive data to or from a first entity through the first antenna module ANT1. The electronic device may transmit or receive data to or from a second entity through the second antenna module ANT2. As one example, the electronic device may transmit or receive data to or from a mobile terminal (User Equipment (UE)) through the first antenna module ANT1. The electronic device may transmit or receive data to or from a control device such as a set-top box or access point (AP) through the second antenna module ANT2.

The electronic device may transmit or receive data to or from other entities through the other antenna modules, for example, the third antenna module ANT3 and the fourth antenna module ANT4. As another example, the electronic device may perform dual connectivity or MIMO with at least one of previously-connected first and second entities through the third antenna module ANT3 and the fourth antenna module ANT4.

The mobile terminals UE1 and UE2 may be disposed on a front area of the electronic device to communicate with the first antenna module ANT1. On the other hand, the set-top box STB or the AP may be disposed on a bottom area of the electronic device to communicate with the second antenna module ANT2 but is not limited thereto. As another example, the second antenna module ANT2 may include a first antenna radiating a signal to the bottom area, and a second antenna radiating a signal to a front area. Therefore, the second antenna module ANT2 may perform communication with the set-top box STB or the AP through the first antenna, and perform communication with one of the mobile terminals UE1 and UE2 through the second antenna.

Meanwhile, one of the mobile terminals UE1 and UE2 may be configured to perform MIMO with the electronic device. As one example, the UE1 may be configured to perform MIMO while performing beamforming with the electronic device. As aforementioned, the electronic device corresponding to the image display device may perform high-speed communication with another electronic device or set-top box through a WiFi wireless interface. As one example, the electronic device may perform high-speed communication with another electronic device or set-top box at 60 GHz through 802.11ay wireless interface.

In the meantime, the transceiver circuit modules 1210a to 1210d may operate to process transmission signals and reception signals at RF frequency bands. Here, the RF frequency bands, as aforementioned, may be arbitrary mmWave frequency bands, such as 28 GHz, 39 GHz, and 64 GHz. The transceiver circuit modules 1210a to 1210d may be referred to as RF sub-modules 1210a to 1210d. At this time, the number of RF sub-modules 1210a to 1210d may not be limited to four, but may vary to an arbitrary number more than two depending on an application.

Also, the RF sub-modules 1210a to 1210d may include an up-conversion module and a down-conversion module that convert a signal of an RF frequency band into a signal of an IF frequency band or a signal of an IF frequency band into a signal of an RF frequency band. To this end, the up-conversion module and the down-conversion module may include a local oscillator (LO) that can perform up-frequency conversion and down-frequency conversion.

The plurality of RF sub-modules 1210a to 1210d may be configured such that a signal is transmitted from one of the plurality of transceiver circuit modules to an adjacent transceiver circuit module. Accordingly, the transmitted signal can be transmitted at least one time to all of the plurality of transceiver circuit modules 1210a to 1210d.

To this end, a data transfer path in a loop structure may be additionally provided. In this regard, the adjacent RF sub-modules 1210b and 1210c may be allowed to perform a bi-directional signal transfer through a transfer path P2 with the loop structure.

Or, a data transfer path in a feedback structure may be additionally provided. In this regard, at least one RF sub-module 1210c is allowed to perform a uni-directional signal transfer to the other RF sub-modules 1210a, 1210b, and 1210c through the data transfer path with the feedback structure.

The plurality of RF sub-modules may include a first RF sub-module to a fourth RF sub-module 1210a to 1210d. In this regard, a signal may be transferred from the first RF sub-module 1210a to the adjacent second RF sub-module 1210B and fourth RF sub-module 1210d. Also, the second RF sub-module 1210b and the fourth RF sub-module 1210d may transfer the signal to the third RF sub-module 1210c. At this time, when the second RF sub-module 1210b and the third RF sub-module 1210c are available to transmit signals bidirectionally, it may be referred to as the loop structure. On the other hand, when the second RF sub-module 1210b and the third RF sub-module 1210c are available to merely transmit signals unidirectionally, it may be referred to as the feedback structure. In the feedback structure, at least two signals may be transferred to the third RF sub-module 1210c.

However, with no limit to this, the baseband module may be disposed in a specific module of the first to fourth RF sub-modules 1210a to 1210d depending on applications. Or, depending on applications, the baseband module may not be disposed in the first to fourth RF sub-modules 1210a to 1210d, but may be configured as a separate controller, namely, a baseband processor 1400. For example, a control signal transfer may alternatively be carried out only by the separate controller, namely, the baseband processor 1400.

Hereinafter, a description will be given of detailed configuration and functions of the electronic device as illustrated in FIG. 1, having wireless interfaces as illustrated in FIG. 2. Electronic devices are needed to transmit or receive data therebetween using communication services in an mmWave band. In this regard, wireless audio-video (AV) service and/or high-speed data transmission may be provided by using 802.11ay wireless interface as the mmWave wireless interface. In this case, the mmWave wireless interface is not limited to the 802.11ay wireless interface, but an arbitrary wireless interface of 60 GHz may be applied. In this regard, a 5G or 6G wireless interface that uses 28 GHz band or 60 GHz band may alternatively be used for high-speed data transmission between electronic devices.

There is no detailed solution to antenna and radio frequency integrated chip (RFIC) providing a wireless interface in an electronic device such as an image display device for transferring images with resolution over 4K. Specifically, considering a situation that the electronic device such as the image display device is disposed on a wall of a building or a table, the electronic device is needed to transmit or receive wireless AV data to or from another electronic device. To this end, a detailed configuration and antenna structure for determining an area of the image display device to dispose the antenna and RFIC should be proposed.

Figure 5A:
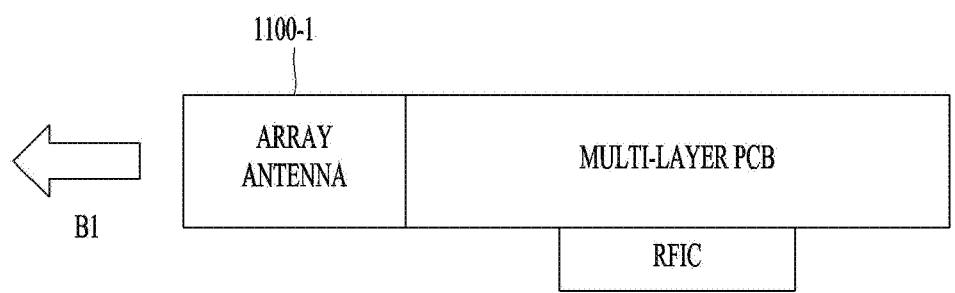
FIG. 5A illustrates a configuration, in which a multi-layered circuit board having an array antenna module thereon is connected to an RFIC, in relation to the present disclosure.
Figure 5A:
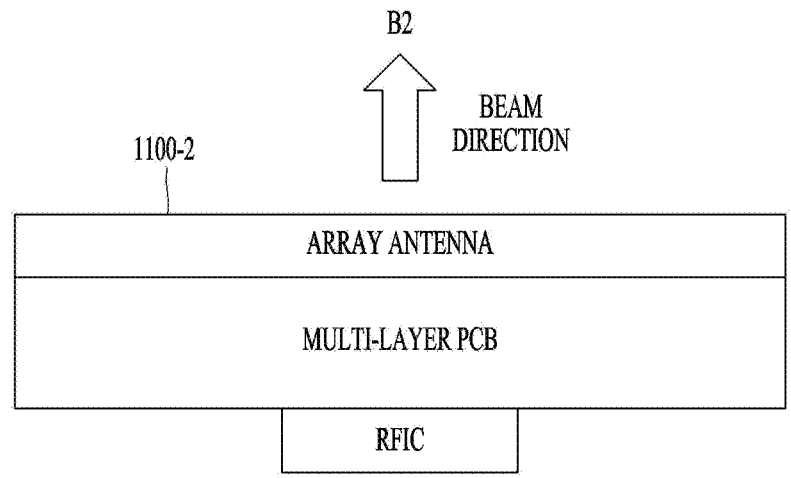

In this regard, FIG. 5A illustrates a configuration, in which a multi-layered circuit board having an array antenna module thereon is connected to an RFIC, in relation to the present disclosure. In detail, FIG. 5A illustrates an antenna in package (AIP) module structure and an antenna module structure implemented on a flexible substrate, in relation to the present disclosure.

Referring to (a) of FIG. 5A, the AIP module is disposed for mmWave band communication, and configured as an integral form of RFIC-PCB-antenna. In this regard, an array antenna module 1100-1, as illustrated in (a) of FIG. 5, may be formed integrally with a multi-layered PCB. Therefore, the array antenna module 1100-1 integrally formed with the multi-layered PCB may be referred to as the AIP module. In detail, the array antenna module 1100-1 may be disposed on one side area of the multi-layered PCB. Accordingly, a first beam B1 may be formed toward the side area of the multi-layered PCB by using the array antenna module 1100-1 disposed on the one side area of the multi-layered PCB.

On the other hand, referring to (b) of FIG. 5A, an array antenna module 1100-2 may be disposed on a top of the multi-layered PCB. The disposition of the array antenna module 1100-2 is not limited to the structure of (b) of FIG. 5A, but may alternatively be disposed on an arbitrary layer inside the multi-layered PCB. Accordingly, a second beam B2 may be formed toward a front area of the multi-layered PCB by using the array antenna module 1100-2 disposed on the arbitrary layer of the multi-layered PCB. The AIP module integrally formed with the array antenna module may be configured such that an array antenna is disposed on the same PCB to minimize a distance between the RFIC and the antenna.

On the other hand, the antenna of the AIP module may be produced through a multi-layered PCBA manufacturing process, and may radiate a signal in a vertical/side direction of the PCB. In this regard, dual polarization may be realized by using a patch antenna, a dipole/monopole antenna, or the like. Therefore, the first array antenna 1100-1 of (a) of FIG. 5A may be disposed on the side area of the multi-layered PCB and the second array antenna 1100-2 of (b) of FIG. 5A may be disposed on the side area of the multi-layered PCB. Accordingly, the first beam B1 may be generated through the first array antenna 1100-1 and the second beam B2 may be generated through the second array antenna 1100-2.

The first array antenna 1100-1 and the second array antenna 1100-2 may be configured to be in the same polarization. Or, the first array antenna 1100-1 and the second array antenna 1100-2 may be configured to be in orthogonal polarizations to each other. In this regard, the first array antenna 1100-1 may operate as a vertically polarized antenna and the second array antenna 1100-2 may operate as a horizontally polarized antenna. As one example, the first array antenna 1100-1 may be a monopole antenna having the vertical polarization and the second array antenna may be a patch antenna having the horizontal polarization.

Figure 5B:
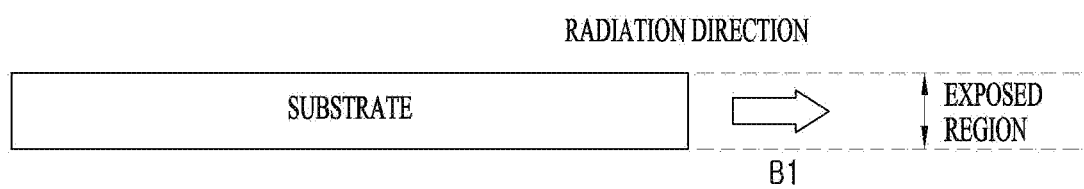
FIG. 5B is a conceptual view illustrating antenna structures having different radiation directions.
Figure 5B:
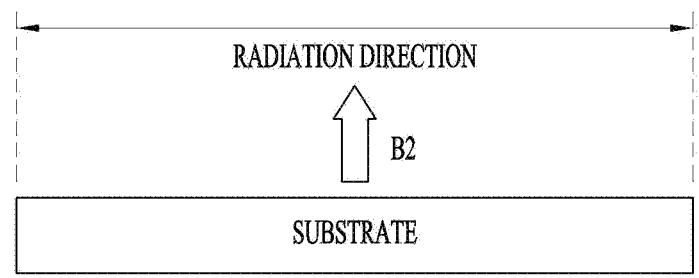

On the other hand, FIG. 5B is a conceptual view illustrating antenna structures having different radiation directions.

Referring to (a) of FIG. 5A and (a) of FIG. 5B, a radiation direction of an antenna module disposed on the side area of the multi-layered PCB corresponds to a lateral (side) direction. In relation, an antenna implemented on a flexible substrate may be configured as radiation elements such as dipole/monopole antennas. That is, the antenna implemented on the flexible substrate may include end-fire antenna elements.

End-fire radiation may be implemented by an antenna that radiates a signal in a horizontal direction with respect to a substrate. The end-fire antenna may be implemented by a dipole/monopole antenna, a Yagi dipole antenna, a Vivaldi antenna, a SIW horn antenna, and the like. Here, the Yagi-dipole antenna and the Vivaldi antenna have horizontal polarization characteristics. Meanwhile, one of antenna modules disposed on the image display device disclosed herein needs a vertically polarized antenna. Therefore, there is a need of proposing an antenna structure capable of minimizing an exposed portion of an antenna while operating as a vertically polarized antenna.

Referring to (b) of FIG. 5A and (a) of FIG. 5B, a radiation direction of an antenna module disposed on the front area of the multi-layered PCB corresponds to a front direction. In relation, an antenna disposed on the AIP module may be configured as radiation elements such as patch antennas. That is, the antenna disposed on the AIP module may include broadside antenna elements that radiate in a broadside direction.

Figure 5C:
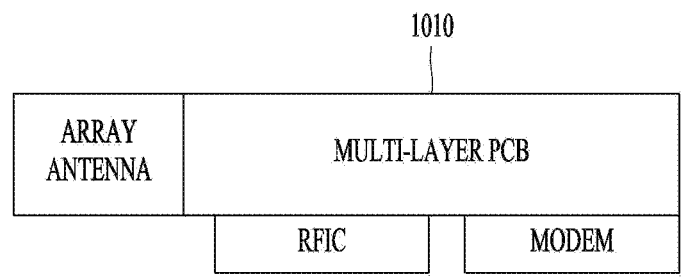
FIG. 5C illustrates coupling structures between a multi-layered substrate and a main substrate in accordance with embodiments.
Figure 5C:
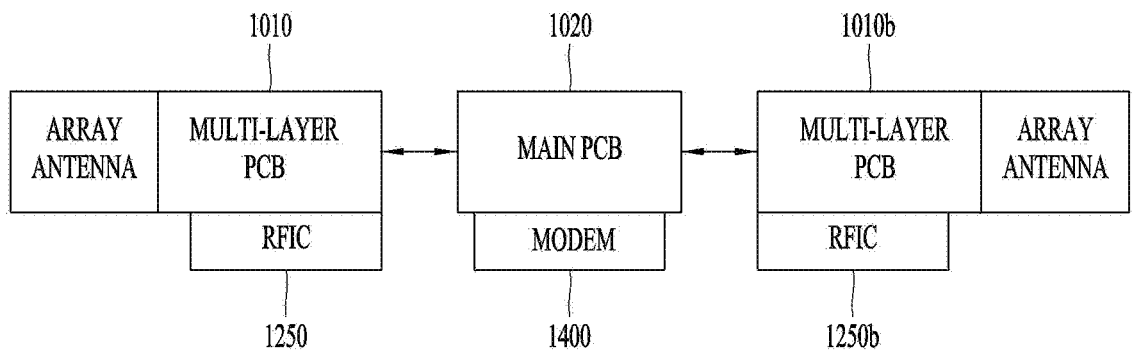

In the meantime, a multi-layered PCB having an array antenna disposed therein may be integrally formed with a main substrate or may be modularly coupled to the main substrate by a connector. In this regard, FIG. 5C illustrates coupling structures between a multi-layered substrate and a main substrate in accordance with embodiments. Referring to (a) of FIG. 5C, a structure in which the RFIC 1250 and the modem 1400 are integrally formed on the multi-layered PCB 1010 is illustrated. The modem 1400 may be referred to as a baseband processor 1400. Therefore, the multi-layered PCB 1010 may be integrally formed with the main substrate. The integral structure may be applied to a structure in which only one array antenna module is disposed in an electronic device.

On the other hand, the multi-layered PCB 1010 and the main substrate 1020 may be modularly coupled to each other by a connector. Referring to (b) of FIG. 5C, the multi-layered PCB 1010 may be interfaced with the main substrate 1020 through the connector. In this case, the RFIC 1250 may be disposed on the multi-layered PCB 1010 and the modem 1400 may be disposed on the main substrate 1020. Accordingly, the multi-layered PCB 1010 may be produced as a separate substrate from the main substrate 1020 and coupled to the main substrate 1020 through the connector.

The modular structure may be applied to a structure in which a plurality of array antenna modules are disposed in an electronic device. Referring to (b) of FIG. 5C, the multi-layered PCB 1010 and a second multi-layered PCB 1010b may be interfaced with the main substrate 1020 through connectors. The modem 1400 disposed on the main substrate 1020 may be electrically coupled to RFICs 1250 and 1250b disposed on the multi-layered PCB 1010 and the second multi-layered PCB 1010b.

Figure 6:
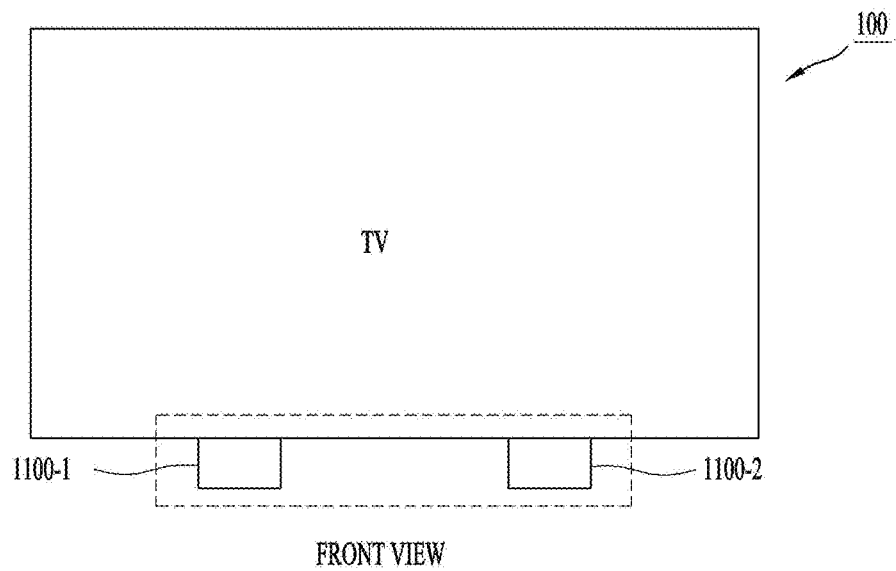
FIG. 6 is a conceptual view illustrating communications with a plurality of communication modules disposed on a lower portion of an image display device and another communication module disposed in a front direction of the image display device.
Figure 6:
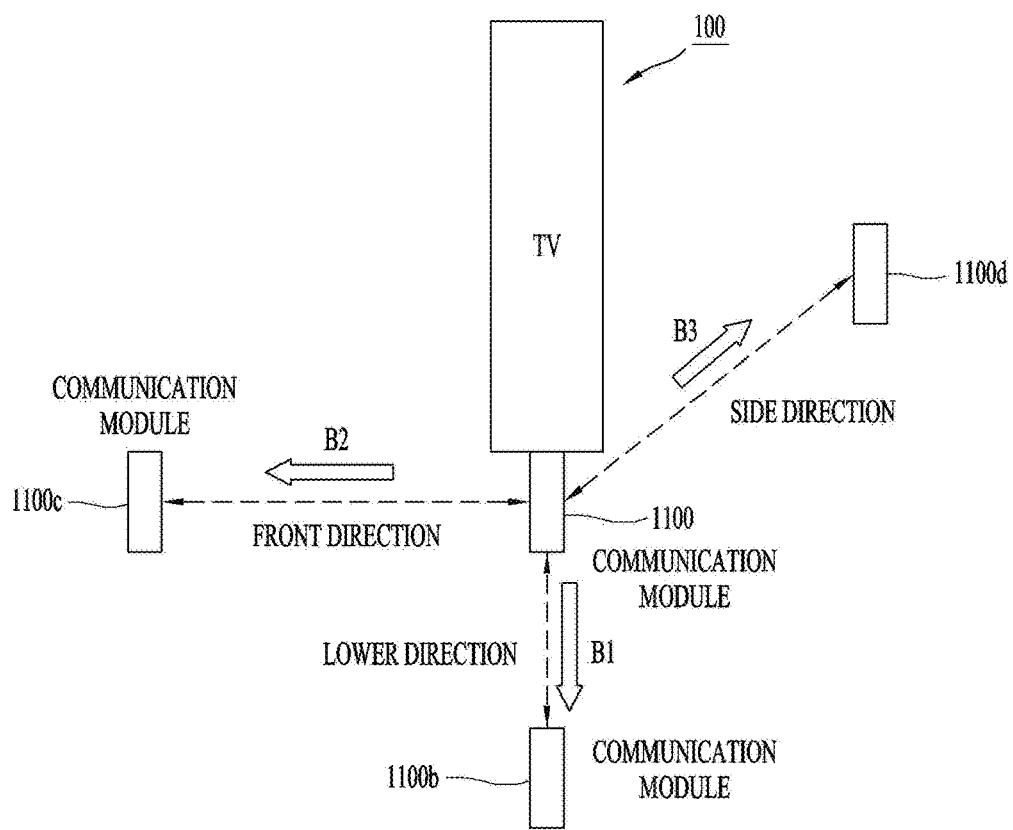

Meanwhile, when the AIP module is disposed beneath the electronic device such as the image display device, it is necessary to communicate with other communication modules disposed in a lower direction and a front direction. In this regard, FIG. 6 is a conceptual view illustrating a plurality of communication modules disposed on a lower portion of an image display device, and communications carried out between the corresponding communication modules and another communication module disposed in a front direction of the image display device. Referring to (a) of FIG. 6, different communication modules 1100-1 and 1100-2 may be disposed on the lower portion of the image display device 100. Referring to (b) of FIG. 6, the image display device 100 may perform communication with a communication module 1100b disposed therebelow through an antenna module 1100. Also, the image display device 100 may perform communication with a second communication module 1100c disposed at the front thereof through the antenna module 1100. Also, the image display device 100 may perform communication with a second communication module 1100d disposed at the side surface thereof through the antenna module 1100.

Here, the communication module 1100b may be a set-top box or AP that transfers AV data to the image display device 100 at high speed through the 802.11ay wireless interface, but is not limited thereto. Also, the second communication module 1100c may be an arbitrary electronic device that transmits and receives data at high speed to and from the image display device 100 through the 802.11ay wireless interface. Meanwhile, to perform wireless communication with communication modules 1100b, 1100c, and 1100d disposed on front, lower, and side surfaces, the antenna module 1100 having a plurality of array antennas forms beams in different directions. Specifically, the antenna module 1100 may form beams in a front direction B1, a lower direction B2, and a side direction B3 through different array antennas.

Meanwhile, an antenna height may increase according to an RFIC driving circuit and a heat dissipation structure in the AIP module structure as illustrated in (a) of FIG. 5A. Also, the antenna height may increase in the AIP module structure as illustrated in (a) of FIG. 5A according to an antenna type used. On the other hand, the antenna module structure implemented on the side area of the multi-layered substrate as illustrated in (b) of FIG. 5A may be implemented as a low-profile type.

Hereinafter, a description will be given of a detailed configuration of the antenna module of FIGS. 5A and 5B to be disposed inside or on a side surface of the electronic device of FIGS. 4 and 6, in the electronic device as illustrated in FIGS. 1 and 2.

An electronic device such as an image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

In this regard, an array antenna that can operate in a millimeter wave (mmWave) band may be mounted in an antenna module. However, an antenna disposed in the antenna module and an electronic component such as a transceiver circuit are electrically connected to each other. To this end, the transceiver circuit may be operably coupled to the antenna module and the antenna module may be configured in the form of a multi-layered substrate.

In the antenna module in the form of the multi-layered substrate, when antenna elements are disposed on a single layer, bandwidths of the antenna elements are limited. On the other hand, when a plurality of antenna elements are stacked on different layers, a coupling change between the antenna elements may sensitively react with a frequency change.

The present disclosure is directed to solving the aforementioned problems and other drawbacks. Another aspect of the present disclosure is to provide a broadband antenna module operating in a millimeter wave (mmWave) band and an electronic device including the same.

Still another aspect of the present disclosure is to improve an antenna gain by enhancing efficiency of antenna elements operating in an mmWave band.

Still another aspect of the present disclosure is to reduce an interference level, upon implementing dual polarization antennas, by reducing a current component of an antenna element operating in an mmWave band in an undesired direction.

Still another aspect of the present disclosure is to optimize antenna performance when an RFIC and an antenna element are connected through a feed line inside a PCB as a multi-layered substrate.

Figure 7A:
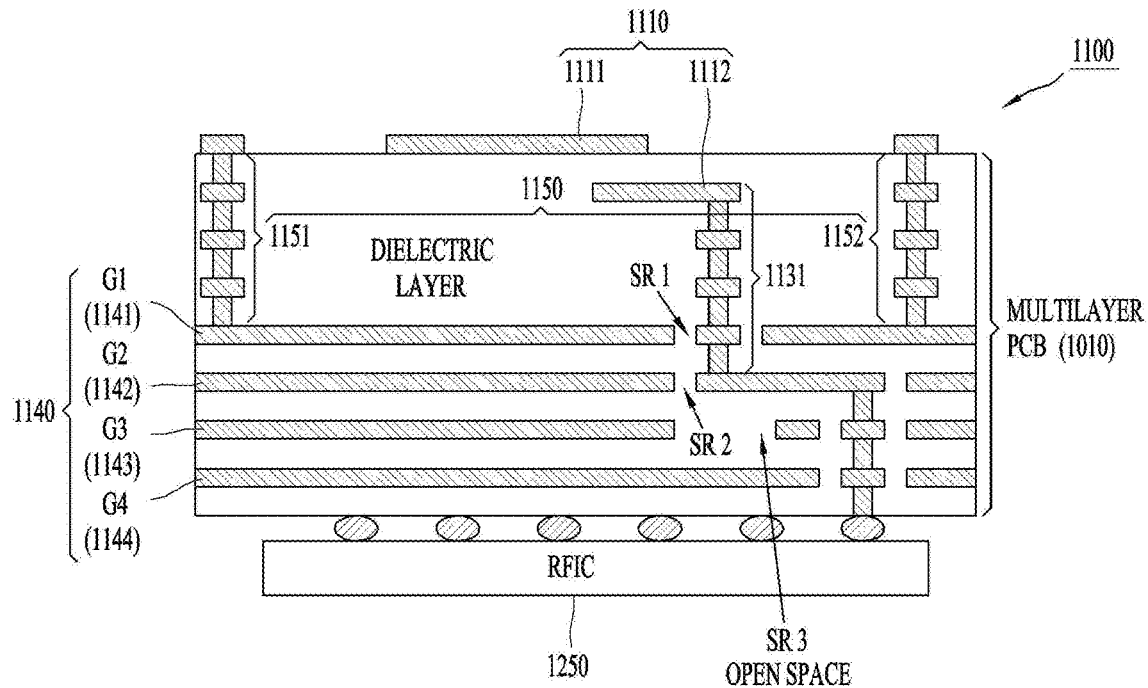
FIG. 7A is a lateral view of an antenna module having a broadband antenna according to the present disclosure.
Figure 7B:
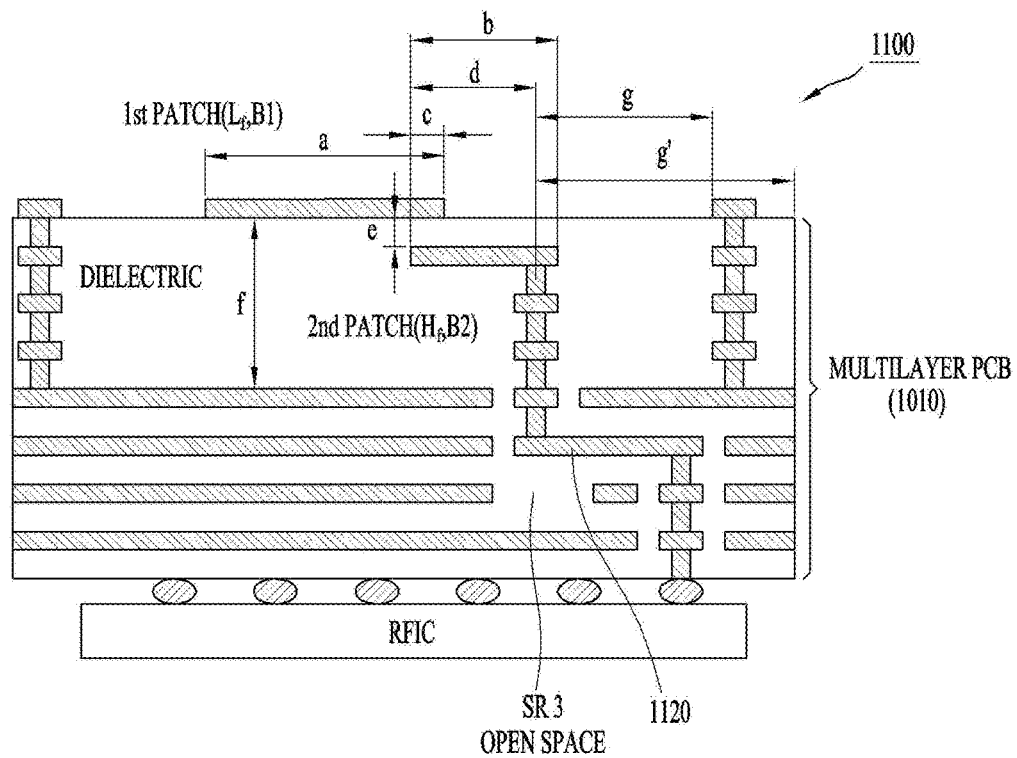
FIG. 7B illustrates size and spacing of radiators disposed on different layers and a spacing between the radiator and a feed line in the lateral view of the antenna module of FIG. 7A.

Hereinafter, an antenna module including a broadband antenna and an electronic device including the same according to the present disclosure will be described. In this regard, FIG. 7A is a lateral view of an antenna module having a broadband antenna according to the present disclosure. FIG. 7B illustrates size and spacing of radiators disposed on different layers and a spacing between the radiator and a feed line in the lateral view of the antenna module of FIG. 7A.

Figure 8A:
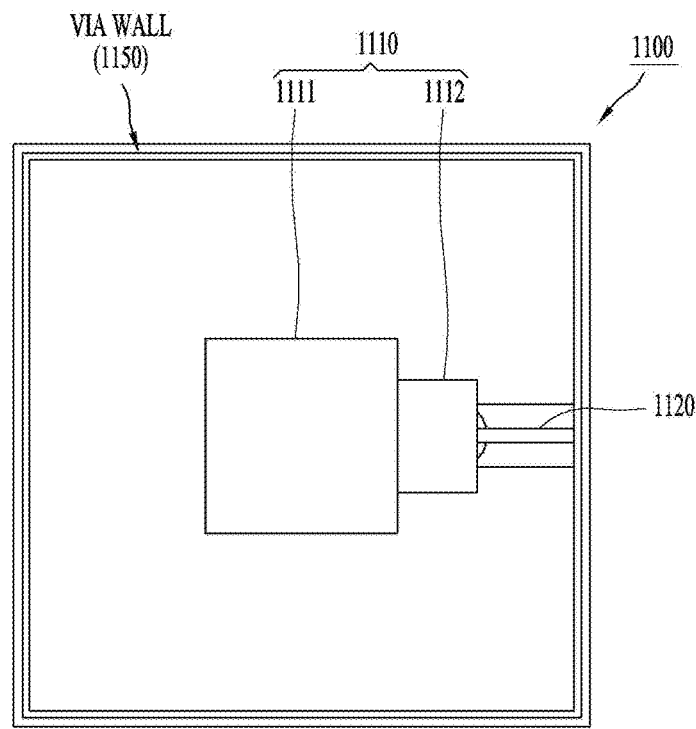
FIG. 8A is a front view of the antenna module of FIG. 7A.
Figure 8B:
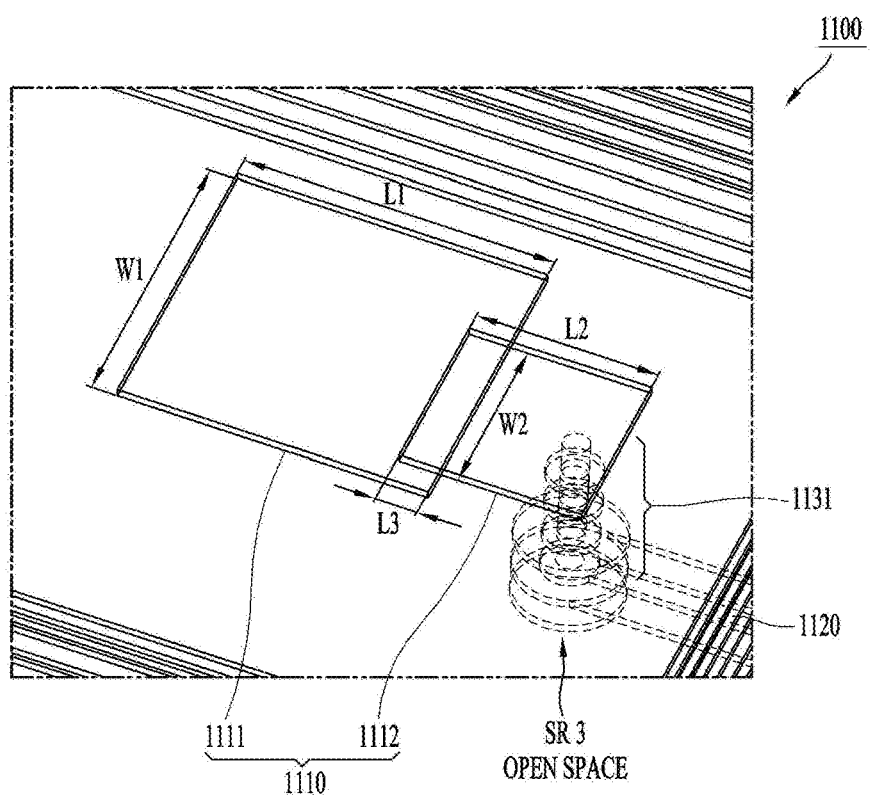
FIG. 8B is a perspective view of the antenna module of FIG. 7A.

FIG. 8A is a front view of the antenna module of FIG. 7A, and FIG. 8B is a perspective view of the antenna module of FIG. 7A.

Referring to FIGS. 7a to 8B, the antenna module 1100 may include a first radiator 1111 and a second radiator 1112. The first radiator 1111 and the second radiator 1112 may be stacked on different layers such that partial regions of the multi-layered substrate 1010 overlap. The first radiator 1111 and the second radiator 1112 may operate as a single antenna element 1110. Therefore, the first radiator 1111 and the second radiator 1112 may be configured to operate at different frequency bands.

The first radiator 1111 may be disposed on an inner region or upper region of the multi-layered substrate 1010 and may be configured as a first conductive layer to radiate a wireless signal. In this regard, as illustrated in FIG. 7A, the first radiator 1111 may be disposed on the upper region, namely, an upper end portion of the multi-layered substrate 1010, but is not limited thereto. A dielectric layer may further be disposed on the top of the first radiator 1111, and thus the first radiator 1111 may also be disposed in the inner region of the multi-layered substrate 1010.

The second radiator 1112 may be disposed on a lower region of the first radiator 1111 to be offset from a center of the first radiator 1111. The second radiator 1112 may be configured as a second conductive layer, like the first radiator 1111, to radiate a wireless signal. Meanwhile, the first radiator 1111 and the second radiator 1112 may overlap each other on one axis. Accordingly, even if a feed line is connected to any one of the first radiator 1111 and the second radiator 1112, one of the first radiator 1111 and the second radiator 1112 may also operate as an antenna.

As illustrated in FIG. 7A, the second radiator 1112 as a lower radiator may be connected to the feed line 1120, but is not limited thereto. The first radiator 1111 as an upper radiator may be connected to the feed line 1120, and the second radiator 1112 as the lower radiator may also operate as an antenna.

The first radiator 1111 and the second radiator 1112 as the antenna element 1100 disclosed herein may be configured to operate independently. Therefore, the first radiator 1111 and the second radiator 1112 may be disposed such that a center of a second patch antenna as the second radiator 1112 and a center of the first patch antenna as the first radiator 1111 are different from each other. In other words, the first radiator 1111 and the second radiator 1112 may be offset such that the center of the second patch antenna 1112 and the center of the first patch antenna 1111 are located at different points. In this regard, the first patch antenna 1111 and the second patch antenna 1112 may overlap each other only in a partial outer region.

The first patch antenna as the first radiator 1111 operates at a low frequency (Lf) band. The second patch antenna as the second radiator 1112 operates at a high frequency (Hf) band. In this instance, the first radiator 1111 and the second radiator 1112 may operate independently at different bands. Therefore, resonance does not occur between the first radiator 1111 and the second radiator 1112, and thus an antenna operating bandwidth is not reduced.

Thus, the first radiator 1111 and the second radiator 1112 may overlap each other on one axis. Also, the first radiator 1111 and the second radiator 1112 may have different lengths on the one axis. Accordingly, the first radiator 1111 and the second radiator 1112 operate at different frequency bands. The first radiator 1111 may be configured to operate at a first frequency band B1 as the low frequency band. On the other hand, the second radiator 1111 may be configured to operate at a second frequency band B2 as the high frequency band.

In this regard, the second radiator 1112 may be disposed such that the first radiator 1111 does not cover an entire region above the second radiator 1112. To this end, the center of the second radiator 1112 is disposed to be offset from the center of the first radiator 1111. This can suppress an antenna characteristic of the second radiator 1112 from being greatly changed due to the first radiator 1111. Therefore, the antenna characteristic of the second radiator 1112 can be maintained almost independently of that of the upper first radiator 1111.

On the other hand, when the first radiator 1111 and the second radiator 1112 are disposed without an overlap region, the first radiator 1111 must be electrically connected to a separate feed line. This causes a problem that one antenna must be fed by two feed lines. Therefore, the present disclosure can propose a broadband antenna structure in which the first radiator 1111 and the second radiator 1112 are fed through one feed line while operating independently of each other.

The first radiator 1111 and the second radiator 1112 may be implemented as a first patch antenna 1111 and a second patch antenna 1112 that are disposed on different dielectric layers. The second patch antenna 1112 may be connected to the feed line 1120 through a signal via 1131. The signal via 1131 may be connected to the second patch antenna 1112 at an offset point on one axis from the center of the second patch antenna 1112. In other words, the signal via, namely, the feed via 1131 may not be connected to a center point of the second patch antenna 1112 and may be spaced in a direction away from the first patch antenna 1111.

Referring to FIGS. 7A and 7B, the signal via 1131 connected to the second patch antenna 1112 of the antenna element 1110 disclosed herein may be disposed beneath a ground layer G1. In this instance, the signal via 1131 may be formed through the ground layer G1 in a spaced manner so as not to be electrically connected to the ground layer G1.

To this end, a slot region SR1 may be formed in the ground layer G1 such that a first pad VP1 of a plurality of pads of the signal via 1131 is disposed on the same layer as the ground layer. Also, the signal via 1131 may be vertically connected to the feed line 1120 beneath the ground layer G1 through the slot region SR1.

The antenna module 1120 may include at least one lower conductive layer on a lower portion of the ground layer G1. In this regard, the antenna module 1120 may include a second lower conductive layer 1142 that is disposed on the same layer as the feed line 1120 below the ground layer G1 to be spaced predetermined distances away from one end portion and another end portion of the feed line 1120. In this instance, the ground layer G1 above the second lower conductive layer 1142 may also be referred to as a first lower conductive layer. Therefore, the plurality of lower conductive layers 1140 may include a first lower conductive layer 1141 and the second lower conductive layer 1142.

Meanwhile, one end portion of the second lower conductive layer 1142 that is spaced apart from the one end portion of the feed line 1120 may be an inner point of a lower region of the second patch antenna 1112. In this regard, a region in which a conductive layer is removed between the one end portion of the feed line 1120 and the one end portion of the second lower conductive layer 1142 may also be referred to as a second slot region SR2.

The second lower conductive layer 1142 may be electrically connected to the ground layer G1 to be implemented as a second ground layer. Alternatively, the second lower conductive layer 1142 may be electrically disconnected from the ground layer G1 to be implemented as a signal line.

On the other hand, the antenna module 1120 may further include a third lower conductive layer 1143 that is disposed below the feed line 1120. As aforementioned, the ground layer G1 above the second lower conductive layer 1142 may also be referred to as a first lower conductive layer. The ground layer G1 above the second lower conductive layer 1142 may also be referred to as a first lower conductive layer. Therefore, the plurality of lower conductive layers 1140 may include the first lower conductive layer 1141, the second lower conductive layer 1142, and the third lower conductive layer 1143.

The third lower conductive layer 1143 may include a third slot region SR3 where a conductive layer is removed from a region corresponding to the lower region of the second patch antenna 1112. A length of the third slot region SR3 on one axis may be longer than lengths of the plurality of pads of the signal via 1131 on the one axis. Therefore, the slot region SR3 is formed by removing a conductive layer from a ground layer G3 which is located below a point where the signal via, namely, the feed via 1131 connected to the second patch antenna 1112 is connected to the feed line 1120.

The third lower conductive layer 1143 may be implemented as a ground layer. Alternatively, depending on an application, the third lower conductive layer 1143 may be implemented as a conductive layer which floats without being electrically connected to a ground layer. The third lower conductive layer 1143 may be implemented as a plurality of conductive layers that are separated from one another. Some of those layers may operate as a ground layer and the others may operate as conductive layers in a floating state.

A region, such as the slot region SR3, from which the conductive layer is removed, may be referred to as an open space. The open space such as the slot region SR3 may lower a resonating frequency of the patch antenna to a low frequency band without increasing a size of the patch antenna. Therefore, as the ground region is partially removed, an entire height of the antenna can increase and thus the antenna can operate as a broadband antenna.

Also, the plurality of lower conductive layers 1140 may include the first lower conductive layer 1141, the second lower conductive layer 1142, the third lower conductive layer 1143, and a fourth lower conductive layer 1144. The fourth lower conductive layer 1144 may be disposed adjacent to a pad of a lower signal via 1133 to cover a lower region of a region where the second patch antenna 1112 is disposed. The fourth lower conductive layer 1144 may be implemented as a ground layer. Alternatively, depending on an application, the fourth lower conductive layer 1144 may be implemented as a conductive layer which floats without being electrically connected to the ground layer. The fourth lower conductive layer 1144 may be implemented as a plurality of conductive layers that are separated from one another. Some of those layers may operate as a ground layer and the others may operate as conductive layers in a floating state.

Meanwhile, the antenna module 1100 may further include a ground via wall 1150 configured by a plurality of pads disposed on an upper portion of the ground layer G1. The ground via wall 1150 may include a first ground via wall 1151 and a second ground via wall 1152 disposed on both sides of the multi-layered substrate 1010 on one axis.

On the other hand, the first and second patch antennas 1111 and 1112 may be implemented as a square patches, but are not limited thereto, and may alternatively be implemented as patch antennas in an arbitrary polygonal shape including triangle and square. The first and second patch antennas 1111 and 1112 may alternatively be implemented as circular patch antennas of FIG. 10B.

The first and second patch antennas 1111 and 112 may be implemented in the same shape, but may alternatively be implemented in different shapes depending on an application. As one example, the second and third patch antennas 1112 and 1113 in a dual feed structure to be explained later in FIGS. 16A and 16B may be implemented as circular patch antennas to minimize an antenna size. The first patch antenna 1111 as the upper antenna may be implemented as one single antenna and have no limitation in the antenna size, so as to be implemented as a square patch antenna.

Figure 9:
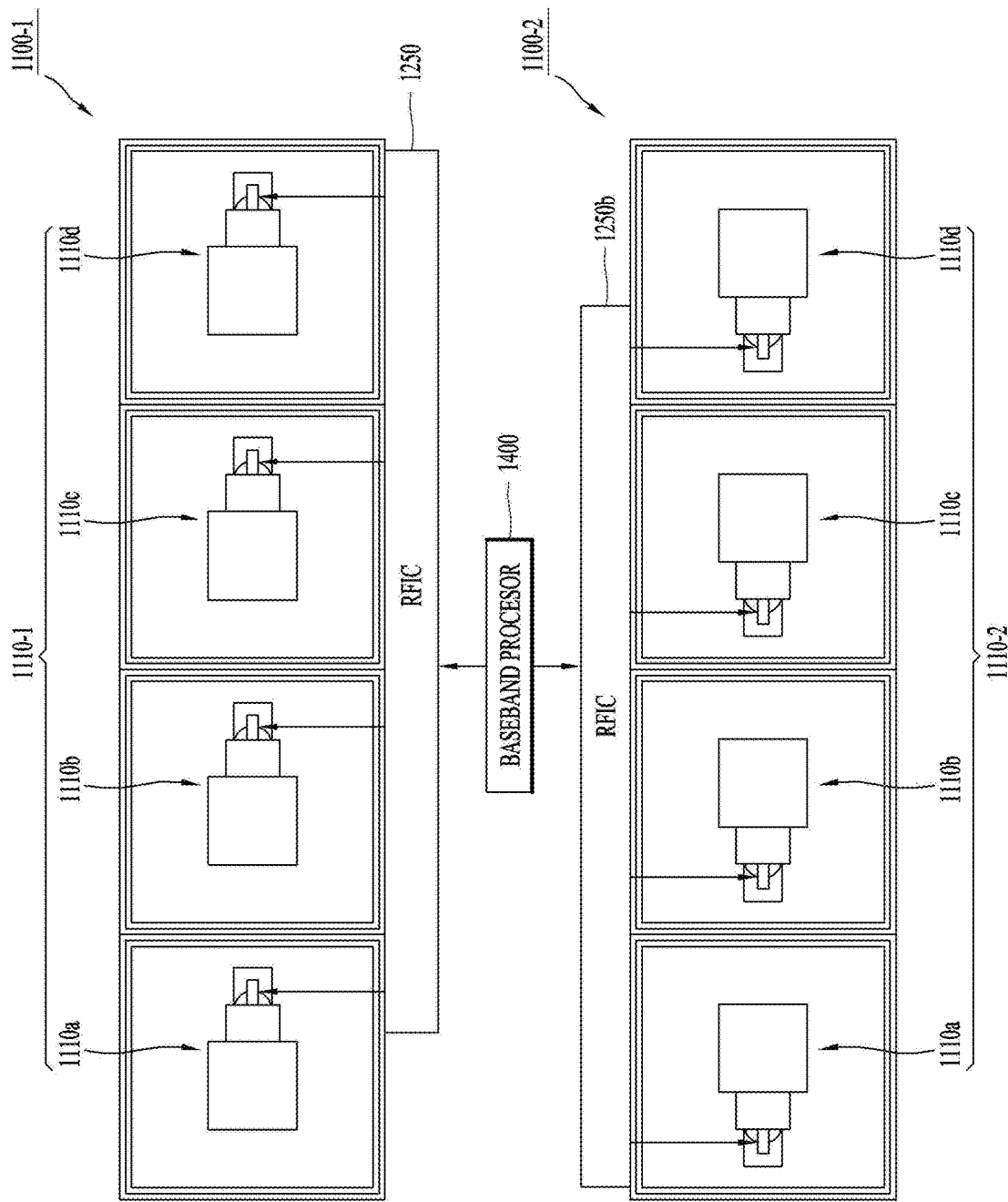
FIG. 9 is a configuration view illustrating that a transceiver circuit is interfaced with a baseband processor when an antenna element disclosed herein is implemented as an array antenna.

An antenna module having a broadband antenna structure disclosed herein may be provided in plurality. The plurality of antenna modules may be controlled by a processor which is separately disposed. In this regard, FIG. 9 is a configuration view illustrating that a transceiver circuit is interfaced with a baseband processor when an antenna element disclosed herein is implemented as an array antenna.

The antenna module 1100 may further include a transceiver circuit 1250. The transceiver circuit 1250 may be disposed in the antenna module 1100 configured by a multi-layered substrate.

As another example, the transceiver circuit 1250 may be separately configured from the multi-layered substrate 1010 formed on the antenna module 1100. In relation to FIG. 5C, a portion of the transceiver circuit 1250 and the baseband processor 1400 may be disposed on a main PCB 1020. In this instance, an RF front end is disposed on the multi-layered substrate 1010 to minimize a signal loss in the mmWave band.

The array antenna 1110-1, 1110-2 may include a plurality of antenna elements 1110a to 1110d. In this regard, each of the plurality of antenna elements 1110a to 1110d may include a first patch antenna 111 operating at a first band, and a second patch antenna 1112 operating at a second band.

The number of antenna elements of the array antenna 1110-1, 1110-2 is not limited to four, but may vary depending on an application. The array antenna 1110-1, 1110-2 may be configured by various number of antenna elements, for example, may be implemented as 1×2, 1×4, or 2×2 array antenna, and may also be implemented as a single polarization antenna or dual-polarization antenna.

The array antennas 1110-1 and 1110-2 may be implemented as the antenna modules 1100-1 and 1100-2, respectively. RFICs 1250 and 1250b may be disposed on the antenna modules 1100-1 and 1100-2, respectively.

The transceiver circuit, namely, the RFIC 1250, 1250b according to the embodiment of the present disclosure may be operably coupled to the baseband processor 1400 corresponding to a modem. When the plurality of antenna modules 1100-1 and 1100-2 are disposed in the electronic device, the RFICs 1250 and 1250b may be disposed on the antenna modules 1100-1 and 1100-2, respectively. Each of the antenna modules 1100-1 and 1100-2, as illustrated in FIG. 5C, may perform wireless communication or perform MIMO with a different electronic device.

Figure 10A:
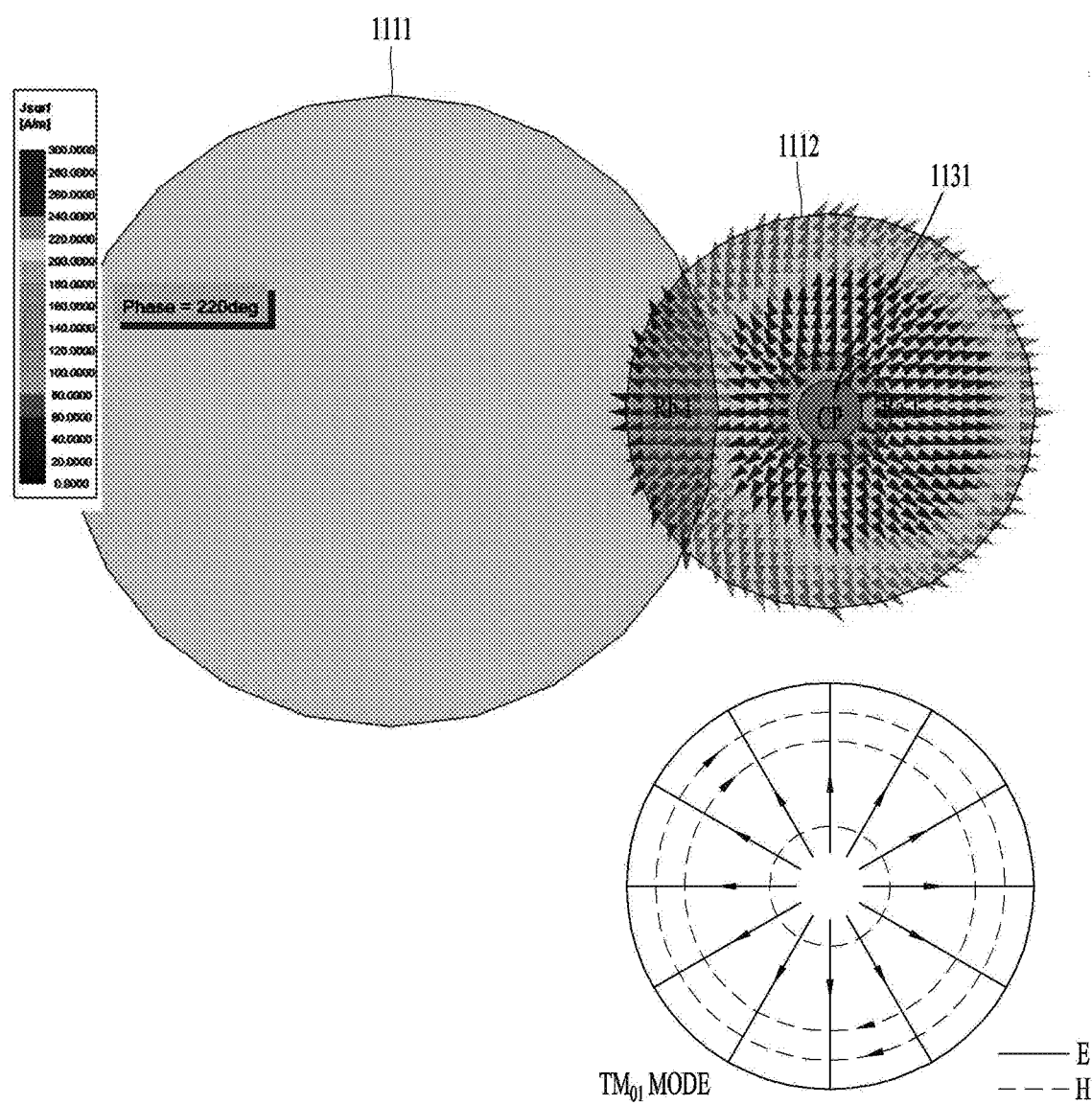
FIGS. 10A and 10B are views illustrating modes established according to a center connection structure and an offset connection structure and current distribution formed on a second patch antenna.
Figure 10B:
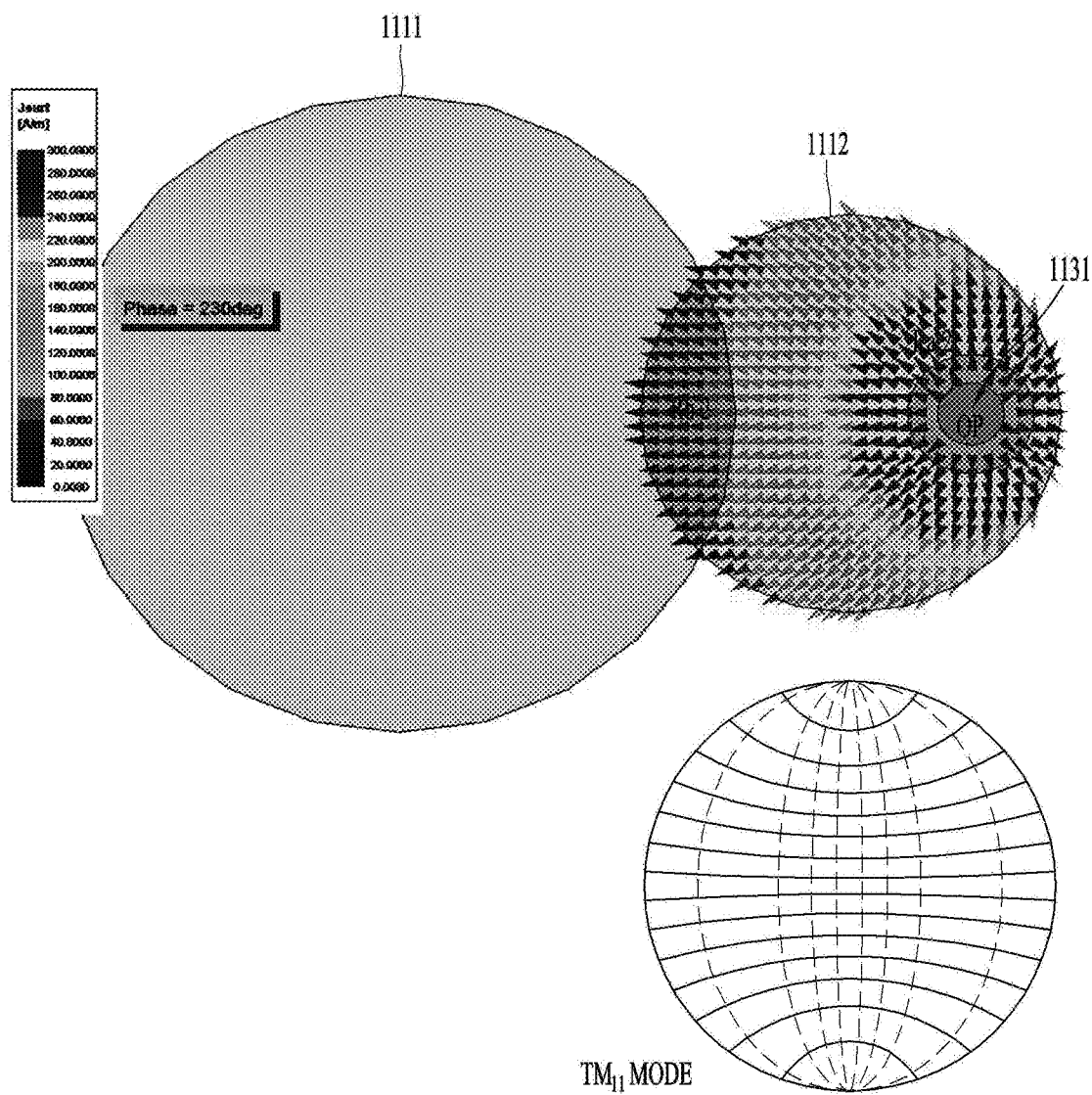
Figure 11A:
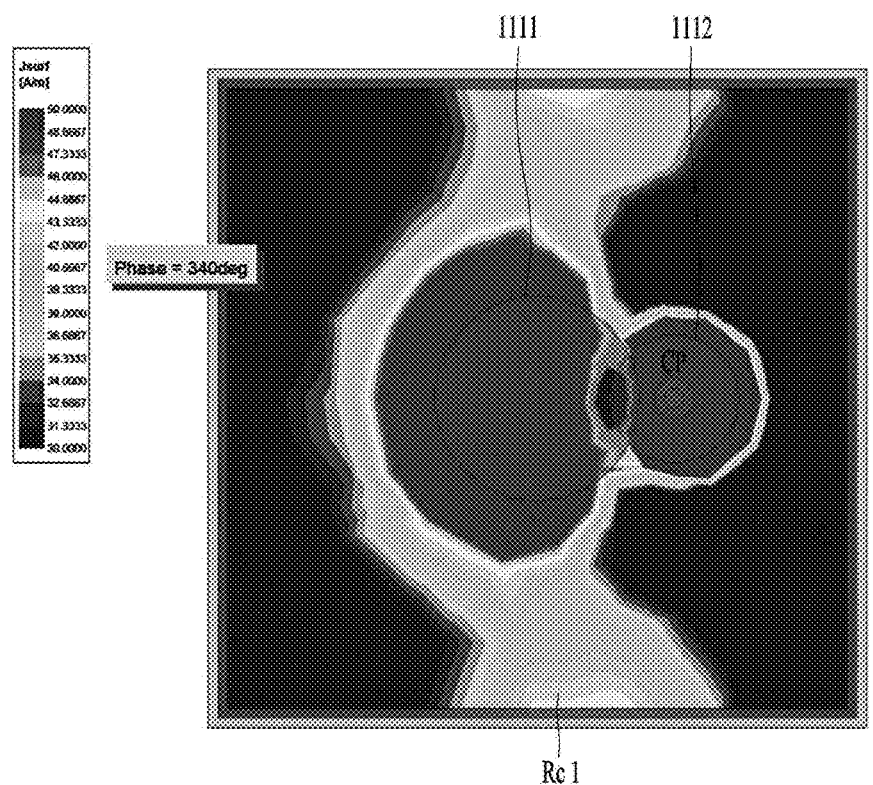
FIGS. 11A and 11B are views illustrating current distributions formed on a second patch antenna according to a center connection structure and an offset connection structure.
Figure 11B:
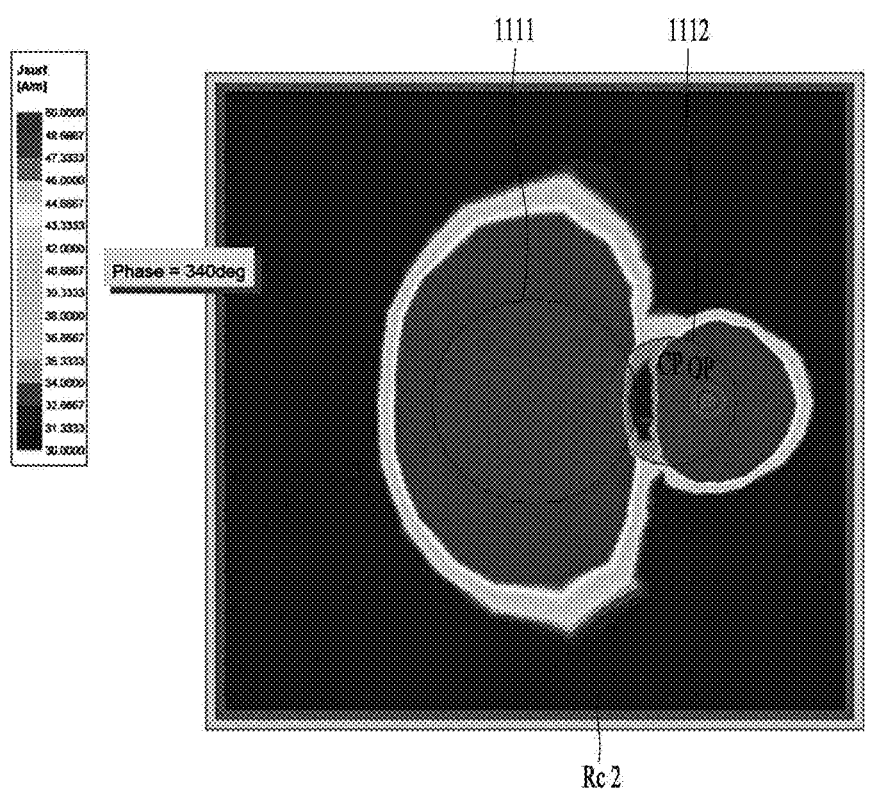

Meanwhile, a current distribution formed on the first patch antenna 1111 and the second patch antenna 1112 is changed by the offset connection structure between the feed line 1120 and the second patch antenna 1112. In this regard, FIGS. 10A and 10B are views illustrating modes formed according to a center connection structure and an offset connection structure and current distribution formed on a second patch antenna. FIGS. 11A and 11B are views illustrating current distributions formed on a second patch antenna according to a center connection structure and an offset connection structure.

In this regard, it is assumed that the first patch antenna 1111 and the second patch antenna 1112 are circular patches, but the shape is not limited thereto. The first patch antenna 1111 and the second patch antenna 1112 may be configured as arbitrary polygonal patches including triangular patches and square patches.

Referring to FIG. 10A, the signal via, namely, the feed via 1131 is connected to a center point CP of the second patch antenna 1112. In this instance, a current distribution in a region Ra1 adjacent to a connected point of the feed via 1131 is higher than a current distribution in a surrounding region Rb1 in up and down directions. However, current values in the surrounding region Rb1 in the up and down directions are not negligible, and thereby may cause signal loss and interference with other antennas. A mode established on the second patch antenna on which the current distribution is made in all directions of the left and right directions and the up and down directions is a TM 01 mode.

Specifically, when the feed via 1131 is connected to the center of the second patch antenna 1112, a current generated in the second patch antenna 1112 spreads up and down and to right and left from the feed via 1131. Accordingly, the second patch antenna 1112 may operate like the TM 01 mode antenna, which may cause performance deterioration when a MIMO channel is distinguished with antenna polarization in the mmWave band. Referring to FIGS. 10A and 11A, an undesired current is generated in the up and down directions in the radiator and the ground due to the current of TM 01 mode generated in the up and down directions in the second patch antenna 1112.

In this regard, as illustrated in FIG. 10B, when the feed via 1131 is connected at an offset point from the second patch antenna 1112, for example, at a right point, a polarization of electronic waves radiated from the second patch antenna 1112 is formed only in the right and left directions. Referring to FIGS. 10B and 11B, the signal via, namely, the feed via 1131 is connected to an offset point OP which is offset by a predetermined distance from the center point of the second patch antenna 1112. In this instance, a current distribution in an adjacent region Ra2 based on the offset point OP where the feed via 1131 is connected is higher than a current distribution in a surrounding region Rb2. Also, a current value in the surrounding region Rb2 is much lower than a current value in the surrounding region Rb1 of FIG. 11A. A mode formed on the second patch antenna on which the current distribution is made in the left and right directions is a TE 11 mode.

However, as illustrated in FIG. 10A, in the TM 01 mode, a current is generated on the second patch antenna in all the up and down and left and right directions. Therefore, a polarization component is also generated by the up and down current in addition to the left and right current. In this case, a signal transmitted through the left and right polarization is transmitted even through the up and down polarization. This may cause disturbance with a signal transmitted from another antenna operating as the polarization antenna in the up and down directions.

In this regard, a current value in an outer region Rc1 where the first and second patch antennas 1111 and 1112 of FIG. 11A are not disposed is equal to or greater than a threshold value. This results from that an undesired current is generated in the up and down directions in the antenna layer and the ground layer due to the current of TM 01 mode generated in the up and down directions on the first and second patch antennas 1112.

The feed via 1131, as illustrated in FIG. 10B, may be connected to the second patch antenna 1112 in a direction away from the center of the first patch antenna 1111. Therefore, the current generated on the second patch antenna 1112 in the left and right directions produces a dominant current distribution. Therefore, the antenna element 1110 operates like the TE 11 mode antenna. This increases left and right co-polarization radiation performance, other than up and down cross-polarization, thereby improving antenna gain performance.

In this regard, a current value in an outer region Rc2 where the first and second patch antennas 1111 and 1112 of FIG. 11B are not disposed is less than a threshold value. This results from that the first and second patch antennas 1112 operate as the TE 11 mode antennas and thus an undesired current is rarely generated in the up and down directions in the antenna layer and the ground layer.

FIGS. 11A and 11B illustrate current distributions produced on the ground of the patch antenna according to the center connection structure and the offset connection structure as illustrated above. Referring to FIG. 11A, it can be seen that the undesired current is not generated in the up and down directions on the ground by the TM 01 mode. Therefore, the up and down cross-polarization component is produced as well as the left and right co-polarization component. This may lower antenna efficiency and deteriorate MIMO channel performance.

Referring to FIG. 11B, the up and down current components are attenuated by the TE 11 mode, so as to substantially disappear. Therefore, the co-polarization radiation performance is increased and the antenna gain is improved. Also, the cross-polarization component can be reduced, and thus data throughput performance improvement can be expected by virtue of MIMO performance improvement.

As aforementioned, the antenna module 1100 may further include a ground via wall 1150 configured by a plurality of pads disposed on an upper portion of the ground layer G1. The ground via wall 1150 may include a first ground via wall 1151 and a second ground via wall 1152 disposed on both sides of the multi-layered substrate 1010 on one axis.

Figure 12A:
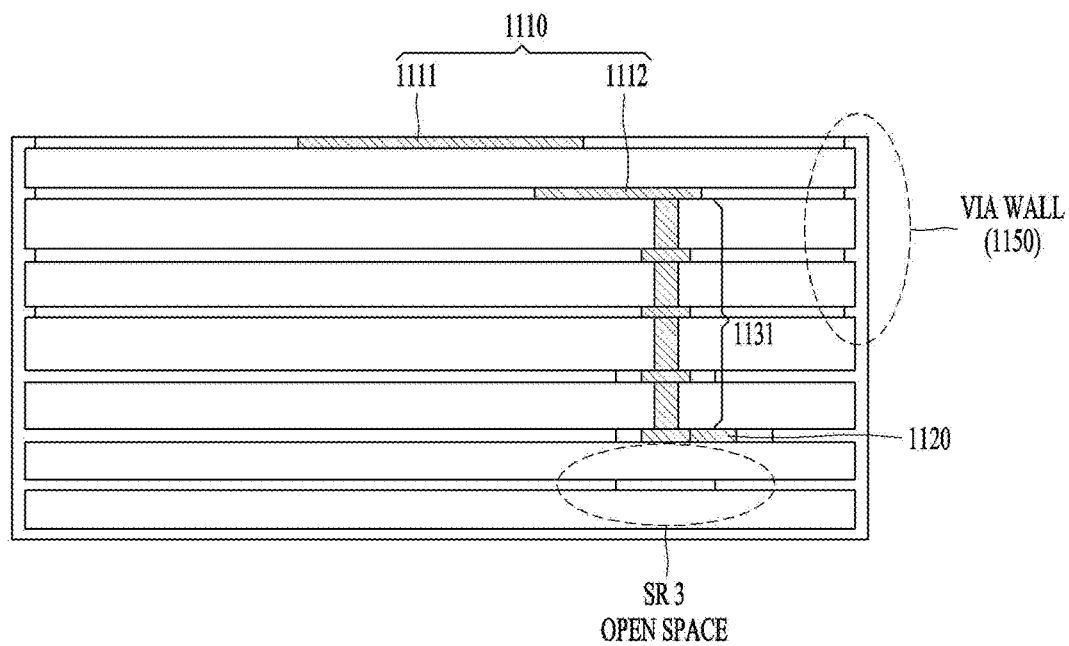
FIG. 12A illustrates a configuration of a multi-layered substrate in which a vial wall is formed along an outer region and an open space is defined in an inner ground layer, in accordance with one embodiment.
Figure 12B:
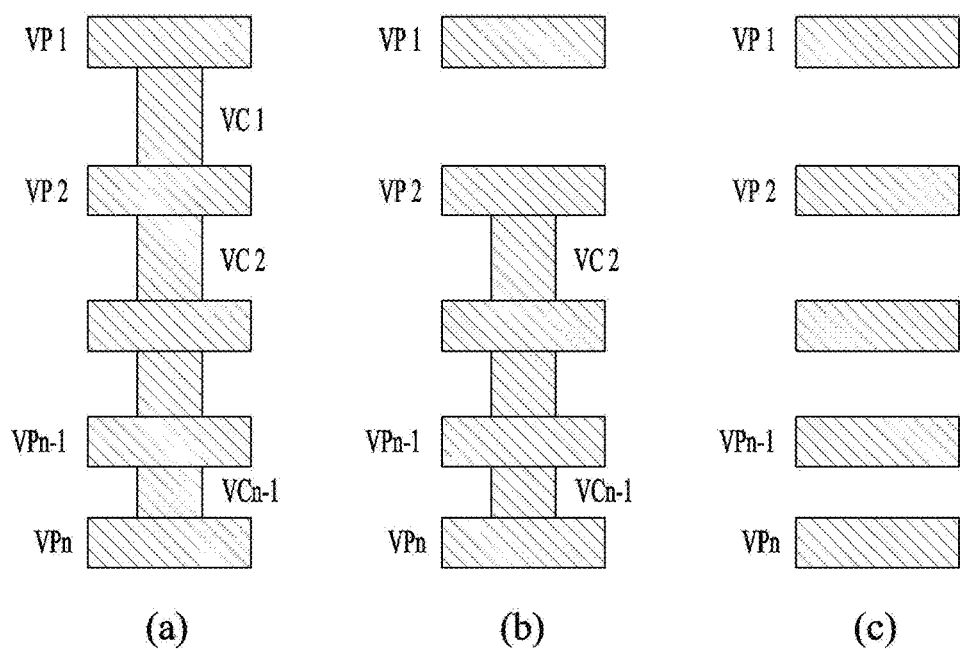
FIG. 12B illustrates via wall formation structures according to various embodiments.

In this regard, FIG. 12A illustrates a configuration of a multi-layered substrate in which a vial wall is formed along an outer region and an open space is defined in an inner ground layer, in accordance with one embodiment. FIG. 12B illustrates via wall formation structures according to various embodiments.

Referring to FIG. 12A, a ground via wall 1150 may be formed along a side region of the multi-layered substrate 1010. The ground via wall 1150 may include a first ground via wall 1151 formed along one side region thereof, and a second ground via wall 1152 formed along another side region.

The ground via wall 1150 may be disposed on an edge of the multi-layered substrate 1010 based on the first patch antenna 1111. Referring to FIGS. 7A, 8A, and 12A, the ground via wall 1150 may be disposed on at least one of four surfaces of upper, lower, left, and right regions based on the first patch antenna 1111. The ground via wall 1150 may be connected to the ground layer G1 to improve the antenna gain. Alternatively, the ground via wall 1150 may be configured as a floating conductive wall merely formed of via pads without a vertical connection portion of vias.

A via pad in a form of a thin film may be disposed on all the layers of the multi-layered substrate 1010, but may alternatively be disposed only on some layers. Referring to (a) and (b) of FIG. 12B, the ground via wall 1150 may include vertical connection portions VC1, VC2, ..., VCn−1, and a plurality of via pads VP1, VP2, ..., VPn−1. Referring to (a) of FIG. 12B, adjacent via pads of the plurality of via pads VP1, VP2, ..., VPn−1 may be connected to each other by one of the vertical connection portions VC1, VC2, ..., VCn−1. On the other hand, referring to (b) of FIG. 12B, at least one of the plurality of via pads VP1, VP2, ..., VPn−1 may not be connected by the vertical connection portion.

As one example, the first pad VP1 and the second pad VP2 may be coupled without a vertical connection portion and the other pads may be connected by the vertical connection portions VP2, ..., VPn−1. However, with no limit thereto, the pads may be connected or may not be connected for each layer. In this regard, when signal lines are disposed in a region adjacent to via walls, the via walls may alternatively be coupled without a vertical connection portion. Upon the coupling without the vertical connection portion, a plurality of conductive layers may configure an electronic band gap (EBG) structure without being electrically connected to the ground layer. This can reduce interference due to an adjacent radiator or signal line or suppress deformation due to pressure or heat applied to the multi-layered substrate 1010.

On the other hand, referring to (c) of FIG. 12B, the plurality of pads VP1, VP2, ..., VPn−1 of the ground via wall 1150 may be coupled without vertical connection portions.

Referring to FIGS. 7A and 12A, the position of the open space corresponding to the third slot region SR3 may be located on the third ground layer G3 disposed below the feed line 1120 connected to the feed via 1131. The open space corresponding to the third slot region SR3 may lower a resonating frequency of an antenna, thereby miniaturizing an antenna size. The size of the open space corresponding to the third slot region SR3 may be greater than the size of the second patch antenna 1112 connected to the feed via 1131.

Figure 13:
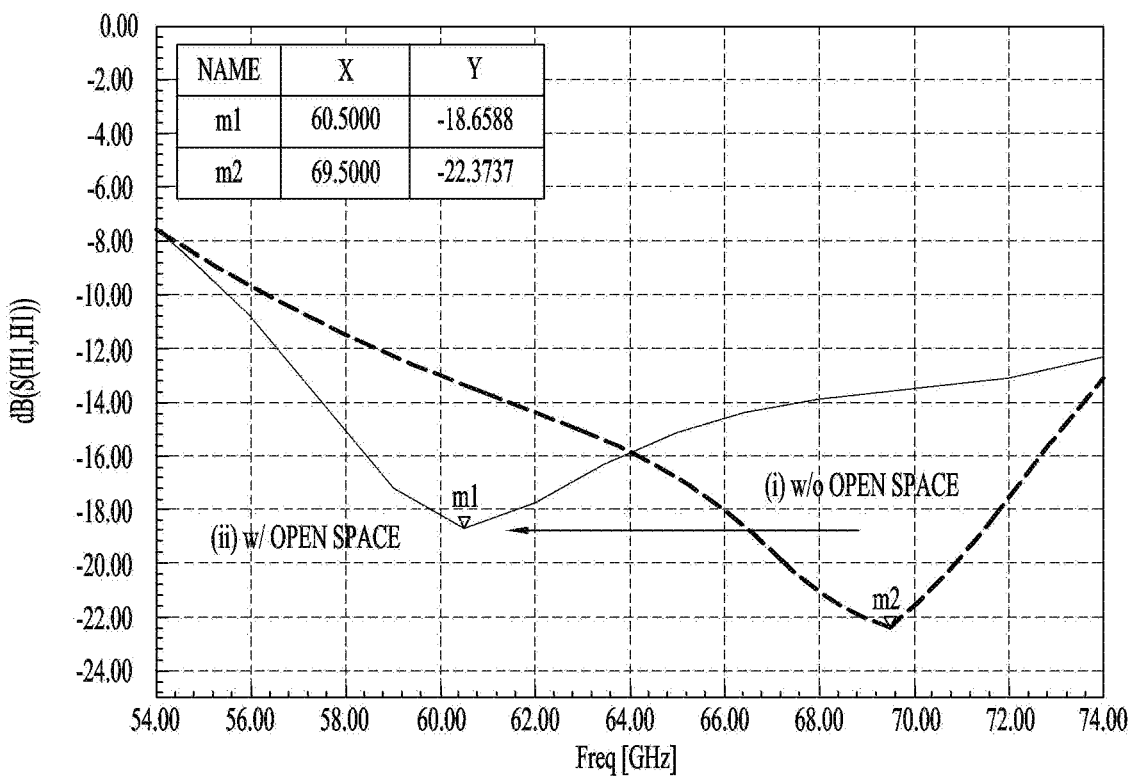
FIG. 13 illustrates a reflection coefficient characteristic according to a formation or non-formation of an open space, such as a slot region, on a ground layer.

On the other hand, FIG. 13 illustrates a reflection coefficient characteristic according to a formation or non-formation of an open space, such as a slot region, on a ground layer. Referring to FIG. 13, it can be seen that a resonating frequency is 69.5 GHz when there is no open space (i), but is adjusted downward when there is an open space (ii). Therefore, as the open space such as the slot region is formed in the ground layer, the resonating frequency of the antenna is changed to a lower band. As the open space such as the slot region is formed in the ground layer beneath the second patch antenna as the lower patch antenna is formed, an effective height of the antenna is increased. Accordingly, the resonating frequency can be adjusted downward or an antenna bandwidth can be increased without an increase in size of the antenna element within the antenna module. Also, an effective dielectric constant of the region with the antenna can reduced and thus antenna efficiency can be improved.

In the meantime, disposition distances among each conductive layer, ground layer, and feed line including the first and second patch antennas 1111 and 1112 of FIG. 7A may be set, as illustrated in FIG. 7B, to optimize antenna performance. In this regard, a size ratio and an overlap ratio between the first and second patch antennas 1111 and 1112 may be set as follows.

Referring to FIGS. 7A and 7B, a ratio (b/a) of a length b of the second patch antenna 1112 on one axis to a length a of the first patch antenna 1111 on the one axis may be set in the range of 0.35 to 0.9. On the other hand, a ratio c/b of an overlapped length c between the first and second patch antennas 1111 and 1112 to the length b of the second patch antenna 1112 on the on axis may be set to a range less than 0.7.

Figure 14A:
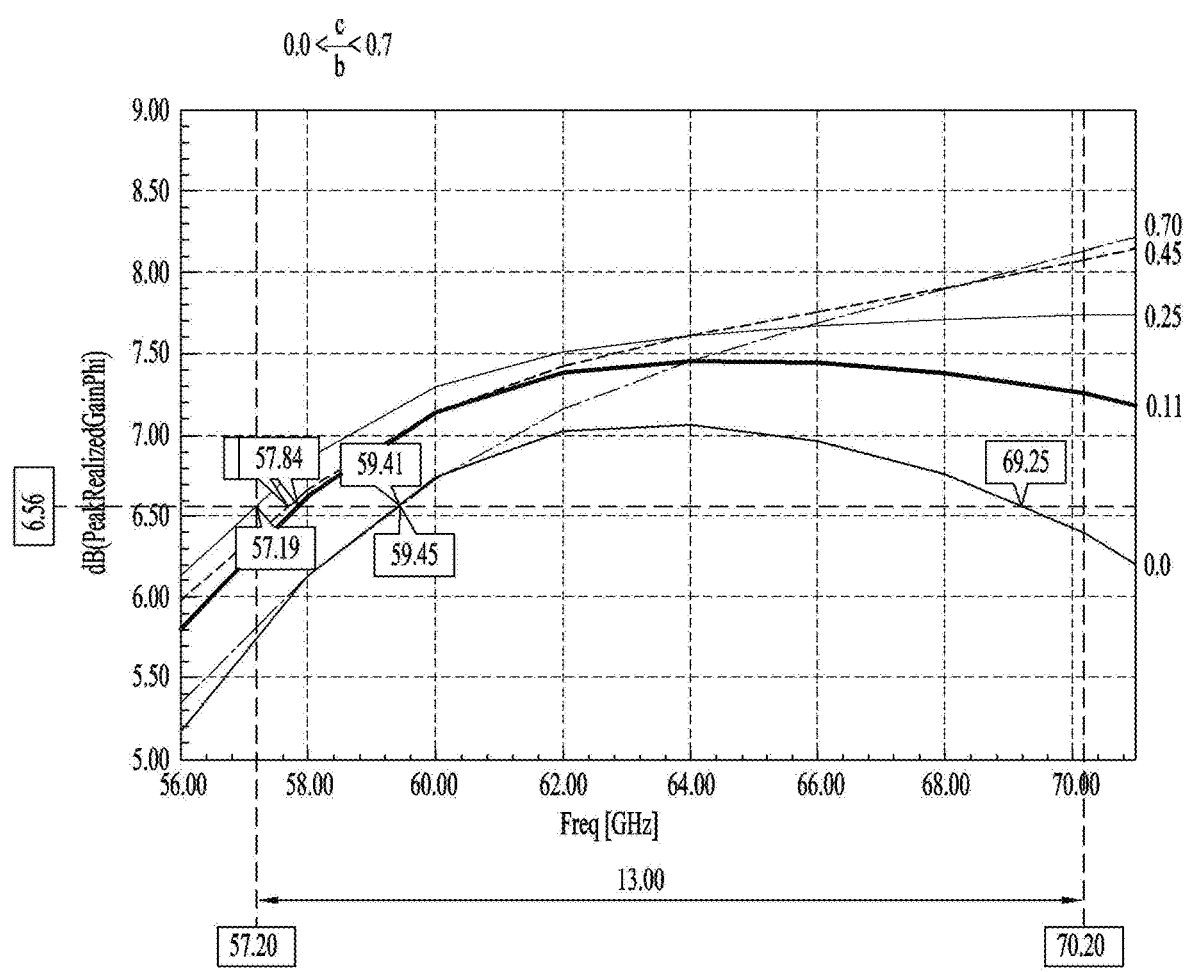
FIG. 14A illustrates an antenna gain for each frequency according to a change of an overlap ratio between first and second patch antennas.

In this regard, FIG. 14A illustrates an antenna gain for each frequency according to a change of an overlap ratio between first and second patch antennas. Referring to FIG. 14A, a change in antenna radiation performance for the ratio c/b of the overlapped length between the first and second patch antennas is illustrated. When the ratio c/b of the overlapped length is 0.25, a stable antenna gain more than 6.5 dBi is exhibited in an entire band of 57.2 to 70.2 GHz. On the other hand, the antenna gain is reduced in the entire band as the ratio c/b of the overlapped length is close to 0. As one example, when the ratio c/b of the overlapped length is 0, an antenna gain of 6.0 dBi or less is obtained at 57.2 GHz and 6.5 dBi or less at 70.2 GHz. That is, antenna performance is deteriorated.

On the other hand, when the ratio c/b of the overlapped length is close to 0.7, an antenna gain is increased at 70.2 GHz but gradually decreased at 57.2 GHz. Therefore, it can be understood that the ratio c/b of the overlapped length mainly affects the antenna performance in the embodiment disclosed herein.

Meanwhile, an offset ratio of a feed position of the second patch antenna 1112 connected to the feed line 1120 may be set as follows. A radio d/b of the length b of the second patch antenna 1112 on one axis to a length d from one end portion of the second patch antenna 1112 to the connected point of the feed line 1120 may be set in the range of 0.5 to 1.

Figure 14B:
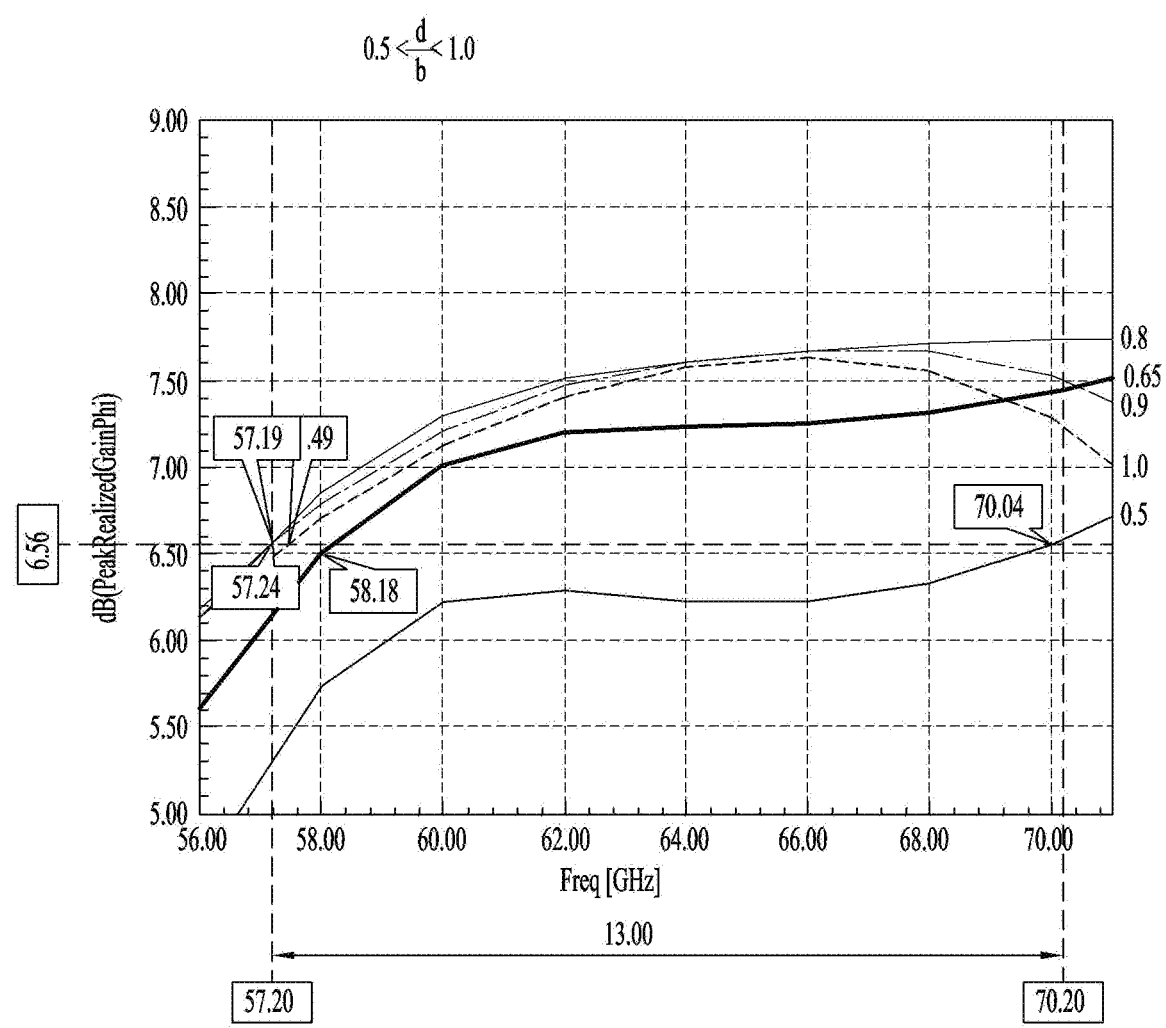
FIG. 14B illustrates an antenna gain for each frequency according to an offset ratio of a feeding position of a second patch antenna.

In this regard, FIG. 14B illustrates an antenna gain for each frequency according to an offset ratio of a feeding position of a second patch antenna. Referring to FIG. 14B, the change of antenna radiation performance according to an offset ratio d/b up to the connected point of the feed line is illustrated. When the offset ratio d/b is 0.8, a stable antenna gain more than 6.5 dBi is exhibited in the entire band of 57.2 to 70.2 GHz.

On the other hand, the antenna gain is reduced in the entire band as the offset ratio d/b is close to 0.5. As one example, when the offset ratio d/b is 0.5, an antenna gain of 5.5 dBi or less is obtained at 57.2 GHz and 6.5 dBi or less at 70.2 GHz. That is, antenna performance is deteriorated.

On the other hand, the antenna gain is reduced in the entire band as the offset ratio d/b is close to 1.0. As one example, when the offset ratio d/b is 1, an antenna gain of 6.5 dBi or less is obtained at 57.2 GHz, and thereby the antenna performance is deteriorated. Therefore, it can be understood that the offset ratio d/b mainly affects the antenna performance in the embodiment disclosed herein.

Meanwhile, a layer on which the second patch antenna 1112 is disposed may be an arbitrary layer between the first patch antenna 1111 and the ground layer G1. As illustrated in FIG. 7, the layer on which the second patch antenna 1112 is disposed may be more adjacent to a layer on which the first patch antenna 1111 is disposed than to the ground layer G1. As one example, a ratio e/f of a vertical distance e between the first patch antenna 1111 and the second patch antenna 1112 to a vertical distance f between the first patch antenna 1111 and the ground layer G1 above the feed line 1120 may be set in the range of 0.1 to 0.5. Therefore, the layer on which the second patch antenna 1112 is disposed may be more adjacent to a layer on which the first patch antenna 1111 is disposed than to the ground layer G1.

The ground via wall 1150, as illustrated in FIG. 12A, may be disposed on a side surface or adjacent to a side region of the multi-layered substrate 1010. Meanwhile, the ground via wall 1150 may be spaced a predetermined distance apart from an end portion of a side surface of the multi-layered substrate 1010.

In this regard, a distance g from the connected point of the feed line to a second ground via wall 1152 may be set to be equal to or less than 0.25 times of a wavelength corresponding to an operating frequency of an antenna element by the first and second patch antennas 1111 and 1112. Similarly, the first ground via wall 1151 may also be disposed to be spaced a predetermined distance apart from an end portion of the multi-layered substrate 1010. However, since a feed line is not disposed adjacent to a region where the first ground via wall 1151 is disposed, the first ground via wall 1151 may alternatively be disposed on a side surface or adjacent to a side region of the multi-layered substrate 1010.

As aforementioned, in relation to the disposition of the broadband antenna having the offset feed structure and the offset overlap structure of FIGS. 7A and 7B disclosed herein, a design parameter may be expressed by the following Formula 1.

$$0.35 < \frac{b}{a} < 0.9 \qquad \text{[Formula 1]}$$
$$0.0 < \frac{c}{b} < 0.7$$
$$0.5 < \frac{d}{b} < 1.0$$
$$0.1 < \frac{e}{f} < 0.5$$
$$0.0 < \frac{g}{\lambda_0} < 0.25$$

As aforementioned, a ratio (b/a) of a length a of the first patch antenna 1111 on one axis to a length b of the second patch antenna 1112 on the one axis may be set in the range of 0.35 to 0.9. On the other hand, a ratio c/b of the length b of the second patch antenna 1112 on the one axis to an overlapped length c between the first and second patch antennas 1111 and 1112 may be set to a range less than 0.7.

Also, a radio d/b of the length b of the second patch antenna 1112 on one axis to a length d from one end portion of the second patch antenna 1112 to a connected point of the feed line 1120 may be set in the range of 0.5 to 1. A ratio e/f of a vertical distance f between the first patch antenna 1111 and the ground layer G1 above the feed line 1120 to a vertical distance e between the first patch antenna 1111 and the second patch antenna 1112 may be set in the range of 0.1 to 0.5. A distance g from the connected point of the feed line to a second ground via wall 1152 may be set to be equal to or less than 0.25 times of a wavelength corresponding to an operating frequency of an antenna element by the first and second patch antennas 1111 and 1112.

Meanwhile, the first and second radiators according to the embodiment of the present disclosure may be configured as patch antennas in various shapes. In this regard, as illustrated in FIGS. 8A and 8B, the first and second radiators may be configured as square patch antennas or arbitrary polygonal patch antennas. Referring to FIGS. 7A to 8B, the first patch antenna 1111 may be configured as a square patch antenna having a first length L1 and a first width W1. Also, the second patch antenna 1112 may be configured as a square patch antenna having a second length L2 and a second width W2. In this case, the first patch antenna 1111 and the second patch antenna 1112 may overlap each other by a third length L3 in a lengthwise direction. Meanwhile, the first patch antenna 1111 and the second patch antenna 1112 may overlap each other by the widths W1 and W2, respectively, in a widthwise direction. Therefore, the first patch antenna 1111 and the second patch antenna 1112 may overlap each other on a region 1112*b* where they overlap each other in the lengthwise and widthwise directions.

Figure 15:
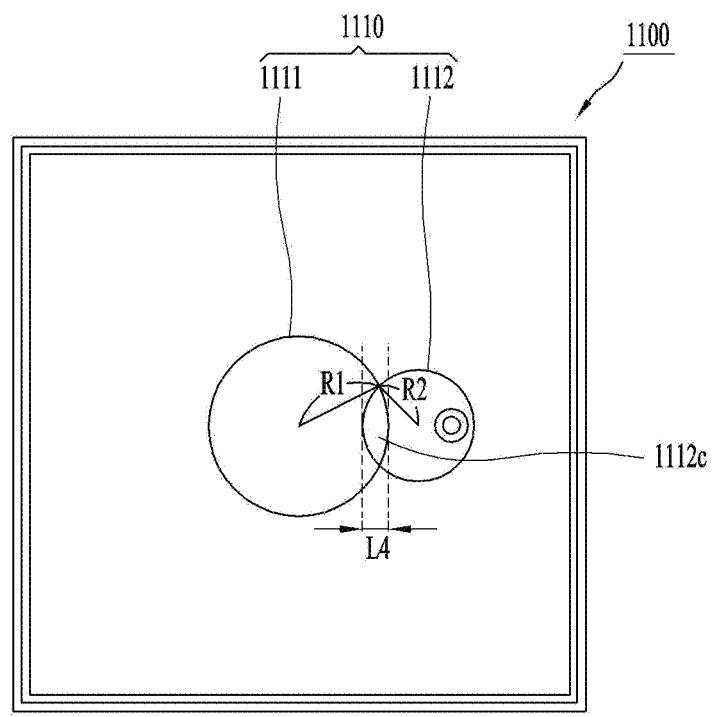
FIG. 15 illustrates a configuration of first and second patch antennas implemented in a circular patch shape in accordance with another embodiment.

As another example, FIG. 15 illustrates a configuration of first and second patch antennas implemented in a circular patch shape in accordance with another embodiment. Referring to FIGS. 7A and 15, the first patch antenna 1111 may be configured as a circular patch antenna having a first diameter R1. The second patch antenna 1112 may be configured as a circular patch antenna having a second diameter R2. The first patch antenna 1111 and the second patch antenna 1112 may overlap each other on an arcuate region 1112*c* where they overlap each other by a fourth length L4 in one axial direction.

Meanwhile, the broadband antenna configuration disclosed herein may also be applied to a dual feed structure. Accordingly, the broadband antenna having the dual feed structure may operate as a dual polarization antenna.

Figure 16A:
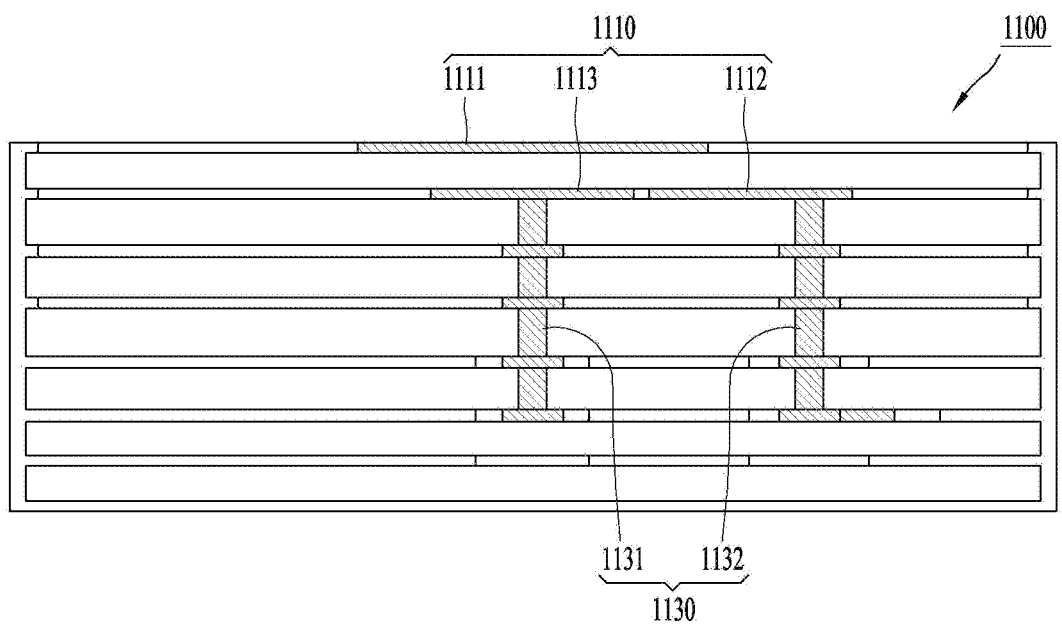
FIG. 16A is a lateral view illustrating a multi-layered substrate in which a broadband antenna configuration disclosed herein is implemented in a dual feed structure.
Figure 16B:
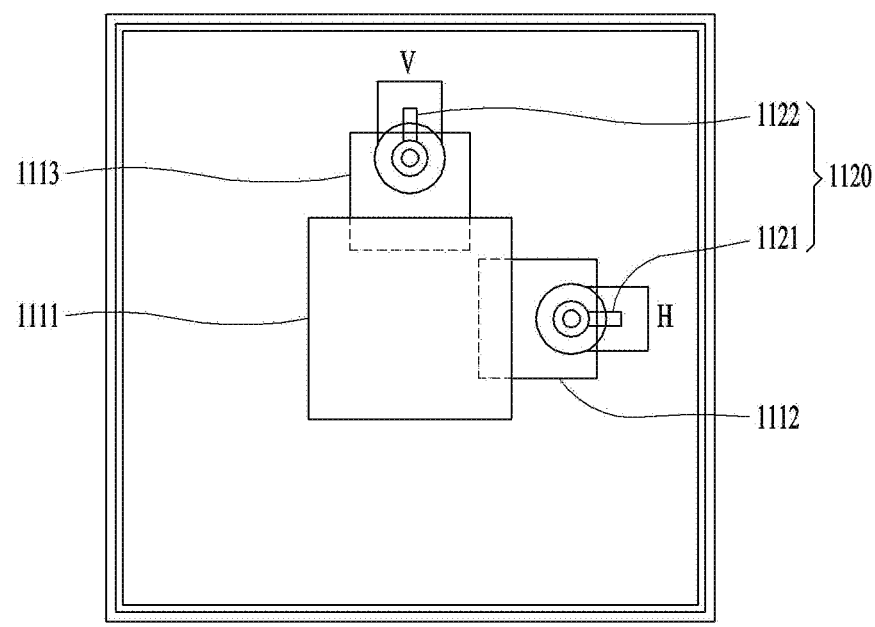
FIG. 16B is a front view illustrating a multi-layered substrate in which a broadband antenna configuration disclosed herein is implemented in a dual feed structure.

In this regard, FIG. 16A is a lateral view illustrating a multi-layered substrate in which a broadband antenna configuration disclosed herein is implemented in a dual feed structure. FIG. 16B is a front view illustrating a multi-layered substrate in which a broadband antenna configuration disclosed herein is implemented in a dual feed structure.

Referring to FIGS. 16A and 16B, the second patch antenna 1112 may be connected to a feed line 1121 through a first signal via 1131 at a first point offset in one axial direction. In this case, it may be considered that the second patch antenna 1112 is connected to the first feed line 1121 through the first signal via 1131 at the first point.

On the other hand, the antenna module 1100 may further include a third patch antenna 1113 that is connected to a second feed line 1122 through a second signal via 1132 at a second point offset in another axial direction orthogonal to the one axial direction. The first signal via 1131 and the second signal via 1132 may be referred to a signal via 1130.

The second patch antenna 1112 and the third patch antenna 1113 may be disposed on the same layer of the multi-layered substrate 1010 in the one axial direction and the another axial direction. The feed line 1120 may refer to one of the first feed line 1121 and the second feed line 1122 in case of a single feed type. On the other hand, in a dual feed type, the feed line 1120 may include a first feed line 1121 and a second feed line 1122.

Accordingly, an antenna element 1110 may radiate a first polarized signal at a second band and a first band by the second patch antenna 1112 and the first patch antenna 1111 connected to the first feed line 1121 in the one axial direction. On the other hand, the antenna element 1110 may radiate a second polarized signal at the second band and the first band by the third patch antenna 1113 and the first patch antenna 1111 connected to the second feed line 1122 in the another axial direction.

In this regard, the first polarized signal may be a horizontally polarized signal and the second polarized signal may be a vertically polarized signal. The first patch antenna 1111 may be implemented as a single element. Meanwhile, lower patch antennas connected to the signal vias, namely, the feed vias 1121 and 1122 may be independently implemented as the second patch antenna 1112 and the third patch antenna 1113.

The second patch antenna 1112 and the third patch antenna 1113 may alternatively be disposed on the same layer or different layers to overlap each other on a partial region. However, when the second and third patch antennas 1112 and 1113 overlap each other on the same layer, an interference level between polarizations orthogonal to each other may increase. On the other hand, when the second and third patch antennas 1112 and 1113 partially overlap each other, an antenna gain difference may occur between dual polarizations. Therefore, to obtain an optimal disposition structure, the second and third patch antennas 1112 and 1113 may be independently implemented not to overlap each other on the same layer.

Accordingly, the second and third patch antennas 1112 and 1113 that are independently disposed not to overlap on the same layer may implement different orthogonal polarizations in a reduced state of the interference level. For example, horizontally polarized signals may be radiated through the first patch antenna 1111 and the second patch antenna 1112 that is disposed on a right region of the first patch antenna 1111. Also, vertically polarized signal may be radiated through the first patch antenna 1111 and the third patch antenna 1113 that is disposed on an upper region of the first patch antenna 1111. Therefore, since the second and third patch antennas 1112 and 1113 are independently implemented not to overlap on the same layer and thus operate as different orthogonal polarization antennas, such antennas can independently operate without interference with each other.

Meanwhile, the first polarized signal and the second polarized signal may not be limited thereto but may be arbitrary polarized signals that are substantially orthogonal to each other. The first band is an operating band of the first patch antenna 1111 and may be a low frequency band. On the other hand, the second band is an operating band of the second patch antenna 1112 and the third patch antenna 1113 and may be a high frequency band.

The transceiver circuit 1250, namely, the RFIC 1250 according to the embodiment of the present disclosure may be operably coupled to the processor 1400 corresponding to a modem. When the plurality of antenna modules 1100-1 and 1100-2 are disposed in the electronic device, the RFICs 1250 and 1250*b* may be disposed on the antenna modules 1100-1 and 1100-2, respectively. Each of the antenna modules 1100-1 and 1100-2, as illustrated in FIG. 5C, may perform wireless communication or perform MIMO with a different electronic device.

In this regard, referring to FIGS. 1 to 16B, the transceiver circuit 1250 may be disposed beneath the multi-layered substrate 1010, and electrically connected to the multi-layered substrate 1010 through a plurality of connection terminals.

One of the plurality of connection terminals of the transceiver circuit 1250 may be connected to the feed line 1120 through a lower signal via 1133. Meanwhile, the signal via 1131 that is connected to the second patch antenna 1112 through the ground layer G1 may also be referred to as an upper signal via 1131. The lower signal via 1133 may be vertically connected to another end portion of the feed line 1120 through the plurality of pads VP1, VP2, . . . , VPn−1 and the vertical connection portions.

Meanwhile, the antenna module according to the present disclosure may be configured as an array antenna that includes antenna elements including the first radiator 1111 and the second radiator 1113. In this regard, referring to FIGS. 5C, 7A, 9, 16A, and 16B, the electronic device may further include the main PCB 1020 that is disposed inside the electronic device to be operably coupled to the multi-layered substrate 1010. The processor 1400 disposed on the main PCB 1020 may control the transceiver circuit 1250 such that the array antenna radiates a wireless signal to another electronic device.

The array antenna 1110-1, 1110-2 may include a plurality of antenna elements 1110a to 1110d. Each of the plurality of antenna elements 1110 to 1110d may include the first and second patch antennas 1111 and 1112. In this case, the first and second patch antennas 1111 and 1112 may operate at the first and second bands, respectively. Each of the plurality of antenna elements 1110a to 1110d may include the first to third patch antennas 1111, 1112 and 1113. In this case, the first patch antenna 1111 may operate at the first band, and the second and third patch antennas 1112 and 1113 may operate at the second band. The second and third patch antennas 1112 and 1113 may operate as orthogonal polarization antennas.

The array antenna 1110-1, 1110-2 may be configured by various number of antenna elements, for example, may be implemented as 1×2, 1×4, or 2×2 array antenna, and may also be implemented as a single polarization antenna or dual-polarization antenna.

The processor 1400 may control the transceiver circuit 1250 to change a frequency band of a signal applied to the array antenna, in consideration of an operating band of the antenna. The processor 1400 may control the transceiver circuit 1250 to perform wireless communication using a first wireless signal of a first band that is radiated through the first radiator 1111 of the array antenna. Meanwhile, the processor 1400 may perform wireless communication with another electronic device through a different frequency band when the first wireless signal has quality equal to or lower than a threshold value.

Accordingly, when quality of a wireless signal is lowered, wireless communication can be performed merely by changing a frequency band without separately performing a beamforming process again. In this regard, as illustrated in (b) of FIG. 6, since the electronic device 100 directly performs wireless communication with other electronic devices 1100b and 1100c without passing through a base station or AP, the electronic device 100 may directly change a frequency band without interoperating with the AP.

When the quality of the first wireless signal is equal to or lower than a threshold value, the processor 1400 may control the transceiver circuit to perform wireless communication using a second wireless signal of a second band that is radiated through the second radiator 1112 of the array antenna. Therefore, the transceiver circuit 1250 may be configured to apply the second wireless signal of the second band to the array antenna through the feed line 1120.

Meanwhile, when quality of another second wireless signal is equal to or lower than the threshold value even after the change of the frequency band, an optimal beam direction may be selected by performing beamforming using the first or second wireless signal.

So far, the electronic device 100 having the antenna module 1100 implemented on the multi-layered substrate 1010 according to the one aspect of the present disclosure has been described. Hereinafter, an antenna module 1100 implemented on a multi-layered substrate 1010 according to another aspect of the present disclosure will be described.

Referring to FIGS. 5A to 16B, the antenna module 1100 may be implemented as a multi-layered substrate 1010. The antenna module 1100 may include a first radiator 1111, a second radiator 1112, and a feed line 1120. The first radiator 1111 may be disposed on an inner region or upper region of the multi-layered substrate 1010 to be configured as a first conductive layer for radiating a first wireless signal of a first band. The second radiator 1112 may be disposed on a lower region of the first radiator 1111 to be offset from a center of the first radiator 1111. The second radiator 1112 may be configured as a second conductive layer to radiate a second wireless signal of a second band. The feed line 1120 may be connected to the second patch antenna 1112 through a signal via 1131.

The first radiator 1111 and the second radiator 1112 may overlap each other on one axis. A length of the first radiator 1111 on one axis and a length of the second radiator 1112 on the one axis may be different from each other. Accordingly, the first radiator 1111 and the second radiator 1112 may operate at different frequency bands, such that the antenna element 1110 can operate as a broadband antenna.

The first radiator 1111 and the second radiator 1112 may be implemented as a first patch antenna 1111 and a second patch antenna 1112 that are disposed on different dielectric layers. The second patch antenna 1112 may be connected to the feed line 1120 through a signal via 1131. The signal via 1131, 1132 may be connected to the second and third patch antennas 1112 and 1113 at an offset point on the one axis from the center of the second patch antenna 1112.

A slot region SR1 may be formed on the ground layer G1 such that a first pad GP1 of a plurality of pads of the signal via 1131, 1132 is disposed on the same layer as the ground layer G1. The signal via 1131, 1132 may be vertically connected to the feed line 1120 beneath the ground layer G1 through the slot region SR1.

The antenna module 1100 may further include a second lower conductive layer 1142 disposed on the same layer as the feed line 1120 by being spaced apart from one end portion and another end portion of the feed line 1120 by predetermined distances, and a third lower conductive layer 1143 disposed beneath the feed line 1120. The third lower conductive layer 1143 may include a third slot region SR3 where a conductive layer is removed from a region corresponding to the lower region of the second patch antenna 1112. A length of the third slot region SR3 on one axis may be longer than lengths of the plurality of pads VP1, VP2, . . . , VPn−1 of the signal via 1131 on the one axis. The third slot region SR3 may be formed on the ground layer G3 corresponding to the third lower conductive layer 1143 so as to reduce an antenna size, and also may be referred to as an open space in the aspect that the ground layer G3 is open.

Figure 17A:
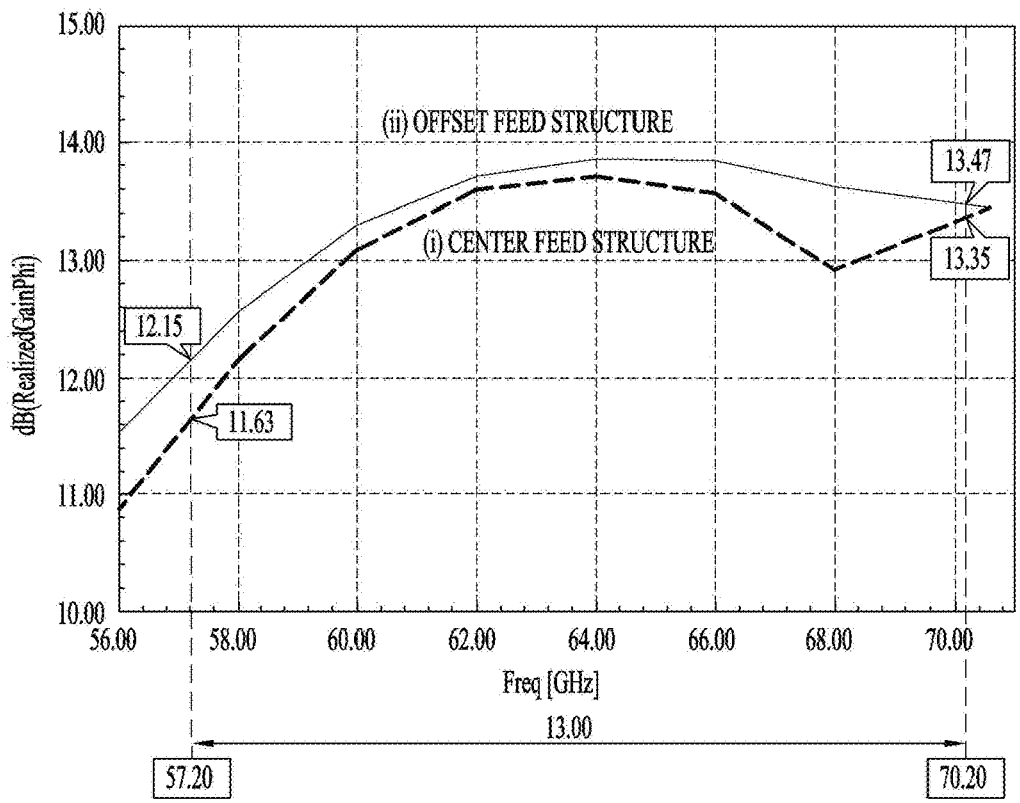
FIG. 17A compares an antenna gain characteristic for each frequency according to the center feed structure of FIG. 10A and the offset feed structure of FIG. 10B.
Figure 17B:
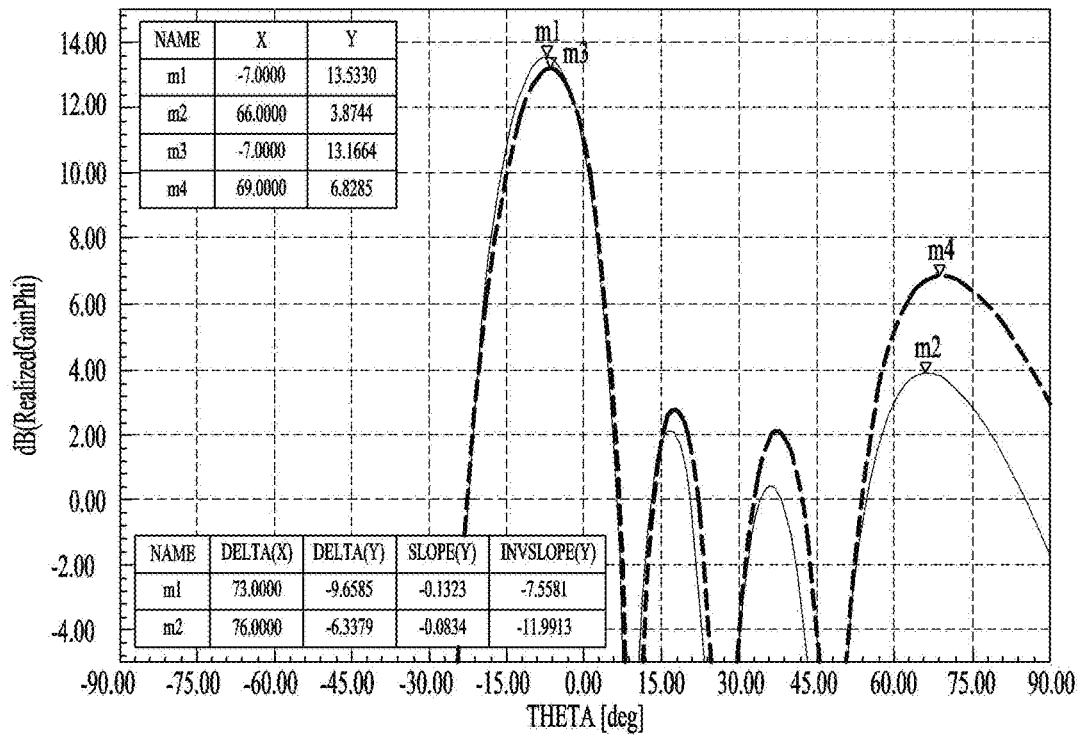
FIG. 17B compares a sidelobe level upon beam tilting according to the center feed structure of FIG. 10A and the offset feed structure of FIG. 10B.

When applying the offset feed structure according to the present disclosure, an improvement of antenna gain and a reduction of a side lobe level (SLL) upon tilting beams can be achieved. In this regard, FIG. 17A compares an antenna gain characteristic for each frequency according to a center feed structure of FIG. 10A and an offset feed structure of FIG. 10B. FIG. 17B compares a side lobe level upon beam tilting according to the center feed structure of FIG. 10A and the offset feed structure of FIG. 10B.

Referring to FIGS. 10B and 17A, antenna efficiency is increased by TE 11 mode of the offset feed structure in which the offset feed structure is applied to an offset point in one axial direction from the center of the second patch antenna 1122 as the lower antenna. Referring to FIG. 17A, an antenna gain improvement of about +0.5 dB can be achieved at an entire band of about 13 GHz corresponding to 57.2 to 70.2 GHz. As such, when implementing 1×4 array antenna using the antenna element 1110 with the improved antenna gain, the array antenna can obtain an antenna gain of 13.9 dBi at the maximum.

Referring to FIGS. 10B and 17A, when applying an offset feed structure at an offset point in one axial direction from the center of the second patch antenna 1122 as the lower antenna, the cross-polarization level is reduced by TE 11 mode, thereby improving radiation pattern efficiency. Referring to FIG. 17B, the array antenna employing the offset feed structure operating in TE 11 mode obtains an improved side lobe level, as compared to the array antenna employing the center feed structure operating in TM 01 mode.

As one example, the array antenna of the center feed structure has an SSL of 13.2−6.8=6.4 dB (SSL=13.2−6.8=6.4 dB). On the other hand, the array antenna of the offset feed structure has an SSL of 13.5−3.9=9.6 dB (SSL=13.5−3.9=9.6 dB). Therefore, a result with an improved SSL of about 3.2 dB can be obtained even without an increase in a disposition distance between the antenna elements 1110 that configure the array antenna. By the improvement of the SSL, an interference effect due to a signal received in a different direction can be lowered.

Figure 18A:
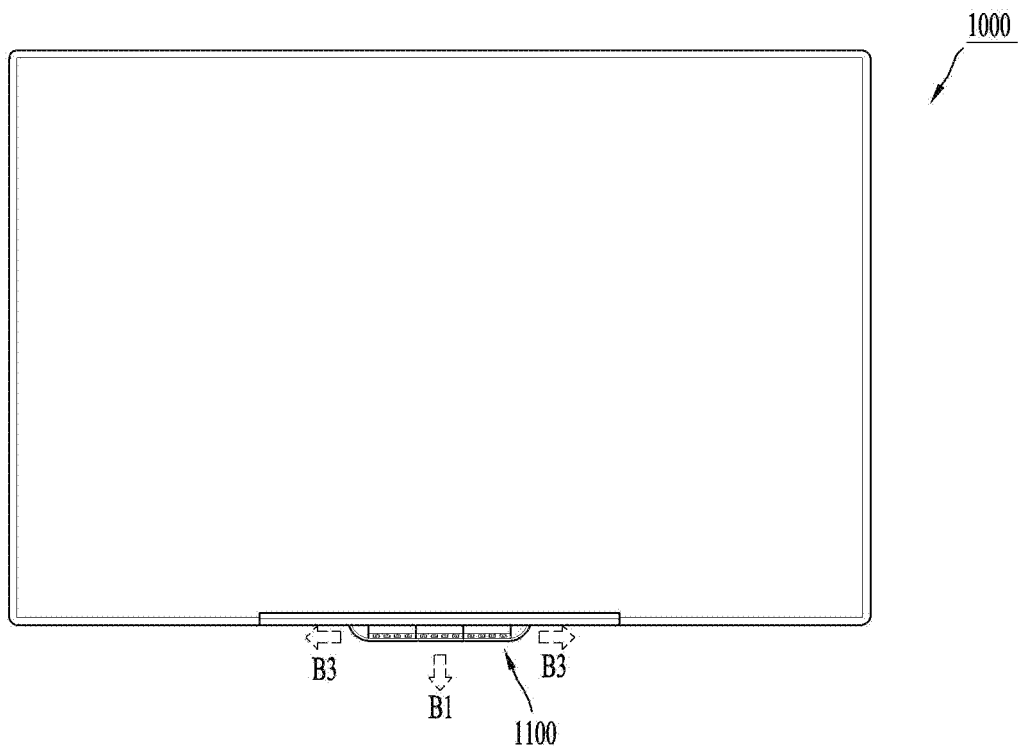
FIG. 18A illustrates a structure in which an antenna module 1100 having a first type antenna and a second type antenna as array antennas is disposed in an electronic device 1000.
Figure 18B:
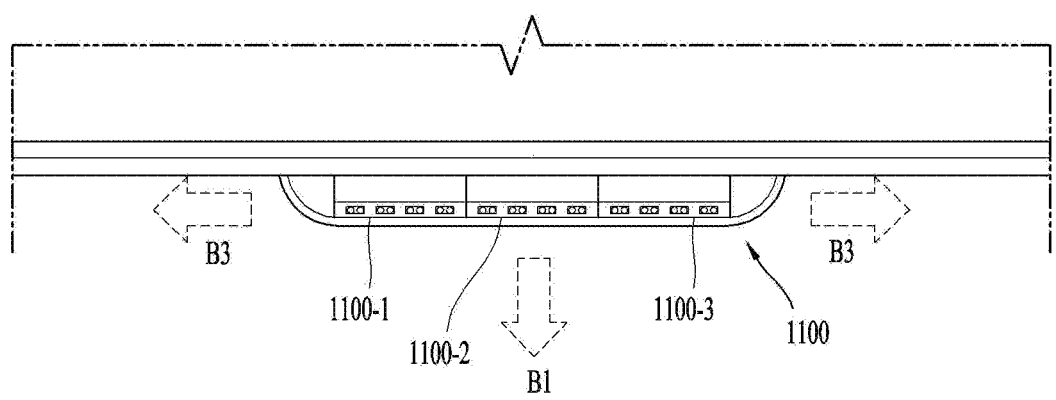
FIG. 18B is an enlarged view illustrating a plurality of array antenna modules.

A side antenna 1100S or a lower antenna 1100L that is implemented in a multi-layered impedance structure disclosed herein may be configured as an array antenna. In this regard, FIG. 18A illustrates a structure in which an antenna module 1100 having a first type antenna and a second type antenna as array antennas is disposed in an electronic device 1000. FIG. 18B is an enlarged view illustrating a plurality of array antenna modules.

Referring to FIGS. 1 to 18B, the array antenna may include a first array antenna module 1100-1, and a second array antenna module 1100-2 spaced apart by a predetermined distance from the first array antenna module 1100-1. Meanwhile, the number of array antennas is not limited to two, but may alternatively be three or more as illustrated in FIG. 18B. Therefore, the array antenna may include a first array antenna module 1100-1 to a third array antenna module 1100-3. As one example, at least one of the first array antenna module 1100-1 and the third array antenna module 1100-3 may be disposed on a side surface of the antenna module 1100 and thus configured to form a beam in a side direction B3.

As another example, at least one of a first array antenna module 1100-1 and a third array antenna module 1100-3 may be disposed on a front surface of the antenna module 1100 and thus configured to form a beam in a front direction B1. In this regard, the first array antenna module 1100-1 and the second array antenna module 1100-2 may form a first beam and a second beam in the front direction B1. The processor 1400 corresponding to the modem of FIG. 5C may control the first and second array antenna modules 1100-1 and 1100-2 to form the first beam and the second beam in the first direction and the second direction, respectively. That is, the processor 1400 may control the first array antenna module 1100-1 to form the first beam horizontally in the first direction. Also, the processor 1400 may control the second array antenna module 1100-2 to form the second beam horizontally in the second direction. In this regard, the processor 1400 may perform MIMO using the first beam of the first direction and the second beam of the second direction.

The processor 1400 corresponding to the modem of FIGS. 5C and 9 may control the first and second array antenna modules 1100-1 and 1100-2 to form the first beam and the second beam in the first direction and the second direction, respectively. That is, the processor 1400 may control the first array antenna module 1100-1 to form the first beam horizontally in the first direction. Also, the processor 1400 may control the second array antenna module 1100-2 to form the second beam horizontally in the second direction. In this regard, the processor 1400 may perform MIMO using the first beam of the first direction and the second beam of the second direction.

The processor 1400 may form a third beam in a third direction using the first and second array antenna module 1100-1 and 1100-2. In this regard, the processor 1400 may control the transceiver circuit 1250 to synthesize signals received through the first and second array antenna modules 1100-1 and 1100-2. Also, the processor 1400 may control the transceiver circuit 1250 to distribute the signals transferred to the first and second array antenna modules 1100-1 and 1100-2 into each antenna element. The processor 1400 may perform beamforming using the third beam that has a beam width narrower than those of the first beam and the second beam.

Meanwhile, the processor 1400 may perform MIMO using the first beam of the first direction and the second beam of the second direction, and perform beamforming using a third beam having the narrower beam width than those of the first beam and the second beam. In relation, when a first signal and a second signal received from other electronic devices in the vicinity of the electronic device have qualities lower than or equal to a threshold value, the processor 1400 may perform beamforming using the third beam.

The number of elements of the array antenna may be two, three, four, and the like as illustrated, but is not limited thereto. For example, the number of elements of the array antenna may be expanded to two, four, eight, sixteen, and the like. Therefore, the array antenna may be configured as 1×2, 1×3, 1×4, 1×5, . . . , 1×8 array antenna.

FIG. 16 illustrates antenna modules coupled in different coupling structures at specific positions of an electronic device according to embodiments. Referring to (a) of FIG. 19, the antenna module 1100 may be disposed substantially horizontal to the display 151 in a lower region of the display 151. Accordingly, a beam B1 can be generated in a downward direction of the electronic device through a monopole radiator. On the other hand, another beam B2 may be generated in a forward direction of the electronic device through a patch antenna.

Figure 19:
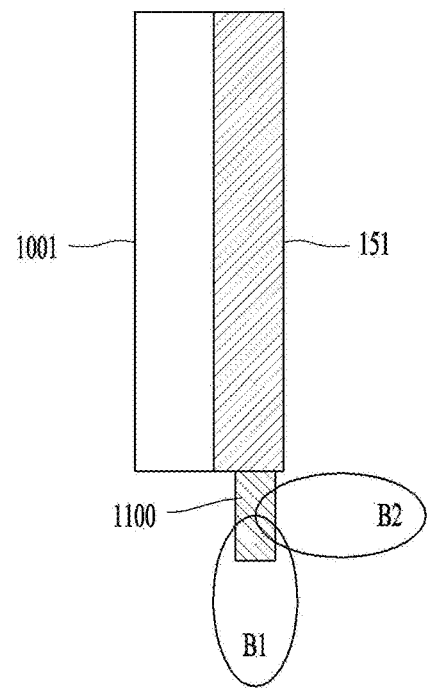
FIG. 19 illustrates antenna modules coupled in different coupling structures at specific positions of an electronic device according to embodiments.
Figure 19:
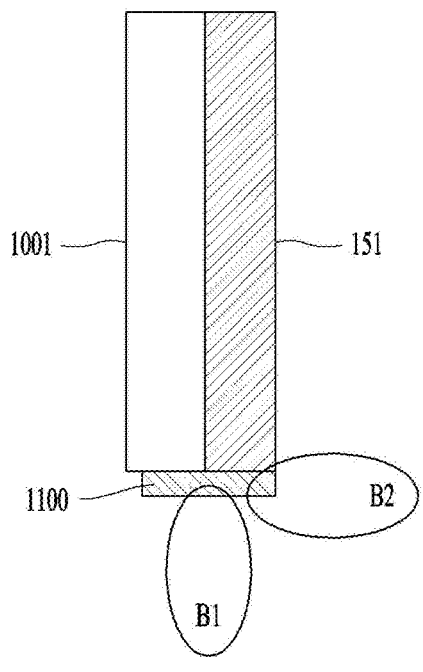
Figure 19:
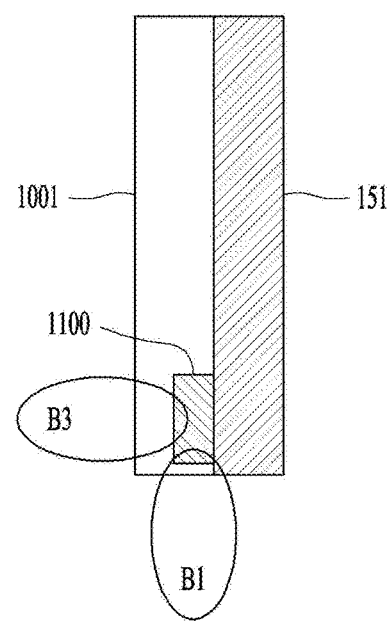

Referring to (b) of FIG. 19, the antenna module 1100 may be disposed substantially vertical to the display 151 in the lower region of the display 151. Accordingly, a beam B2 may be generated in a forward direction of the electronic device through the monopole radiator. On the other hand, another beam B1 may be generated in a downward direction of the electronic device through the patch antenna.

Referring to (c) of FIG. 19, the antenna module 1100 may alternatively disposed inside a rear case 1001 corresponding to a mechanism structure. The antenna module 1100 may be disposed inside the rear case 1001 to be substantially parallel to the display 151. Accordingly, a beam B2 can be generated in a downward direction of the electronic device through a monopole radiator. On the other hand, another beam B3 may be generated in a rearward direction of the electronic device through a patch antenna.

Hereinafter, array antenna modules 1100-1 to 1100-3 implemented on a multi-layered substrate 1010 according to an embodiment of the present disclosure will be described with reference to FIGS. 1 to 19.

The array antenna modules 1100-1 to 1100-3 may be implemented as a multi-layered substrate 1010. The antenna module 1100 may include a first radiator 1111, a second radiator 1112, and a feed line 1120. The first radiator 1111 may be disposed on an inner region or upper region of the multi-layered substrate 1010 to be configured as a first conductive layer for radiating a first wireless signal of a first band. The second radiator 1112 may be disposed on a lower region of the first radiator 1111 to be offset from a center of the first radiator 1111. The second radiator 1112 may be configured as a second conductive layer to radiate a second wireless signal of a second band. The feed line 1120 may be connected to the second patch antenna 1112 through a signal via 1131.

The first radiator 1111 and the second radiator 1112 may overlap each other on one axis. A length of the first radiator 1111 on one axis and a length of the second radiator 1112 on the one axis may be different from each other. Accordingly, the first radiator 1111 and the second radiator 1112 may operate at different frequency bands, such that the antenna element 1110 can operate as a broadband antenna.

The first radiator 1111 and the second radiator 1112 may be implemented as a first patch antenna 1111 and a second patch antenna 1112 that are disposed on different dielectric layers. The second patch antenna 1112 may be connected to the feed line 1120 through a signal via 1131. The signal via 1131, 1132 may be connected to the second and third patch antennas 1112 and 1113 at an offset point on the one axis from the center of the second patch antenna 1112.

A slot region SR1 may be formed on the ground layer G1 such that a first pad GP1 of a plurality of pads of the signal via 1131, 1132 is disposed on the same layer as the ground layer G1. The signal via 1131, 1132 may be vertically connected to the feed line 1120 beneath the ground layer G1 through the slot region SR1.

The array antenna module 1100-1 to 1100-3 may further include a second lower conductive layer 1142 disposed on the same layer as the feed line 1120 by being spaced apart from one end portion and another end portion of the feed line 1120 by predetermined distances, and a third lower conductive layer 1143 disposed beneath the feed line 1120. The third lower conductive layer 1143 may include a third slot region SR3 where a conductive layer is removed from a region corresponding to the lower region of the second patch antenna 1112. A length of the third slot region SR3 on one axis may be longer than lengths of the plurality of pads VP1, VP2, . . . , VPn−1 of the signal via 1131 on the one axis. The third slot region SR3 may be formed on the ground layer G3 corresponding to the third lower conductive layer 1143 so as to reduce an antenna size, and also may be referred to as an open space in the aspect that the ground layer G3 is open.

So far, the broadband antenna module operating in the millimeter wave (mmWave) band and the electronic device having the same have been described. Hereinafter, technical effects of a broadband antenna module operating in a millimeter wave (mmWave) band and an electronic device having the same will be described.

According to an embodiment, a broadband antenna module operating in a millimeter wave (mmWave) band by operating a plurality of stacked radiators in an independent manner, and an electronic device having the same can be provided.

According to an embodiment, efficiency of an antenna element that operates in an mmWave band can be improved and an antenna gain can be increased by applying an offset feed structure to a lower radiator.

According to an embodiment, efficiency of an antenna element that operates in an mmWave band can be improved and an antenna gain can be increased by disposing an open space such as a slot region below a feed line.

According to an embodiment, a current component, which is generated in an antenna element operating in an mmWave band in an undesired direction, can be reduced by applying an offset feed structure to a lower radiator.

According to an embodiment, an interference level can be lowered, when implementing a dual polarization antenna, by applying an offset feed structure to a lower radiator.

According to an embodiment, when an RFIC and an antenna element are connected in a PCB as a multi-layered substrate through a feed line, a shape of a feed via structure and a connected point thereof can be optimized, thereby enhancing antenna performance as high as possible.

Further scope of applicability of the present disclosure will become apparent from the following detailed description. It should be understood, however, that the detailed description and specific examples, such as the preferred embodiments of the present disclosure, are given by way of illustration only, since various modifications and alternations within the spirit and scope of the disclosure will be apparent to those skilled in the art.

Further scope of applicability of the present disclosure will become apparent from the following detailed description. It should be understood, however, that the detailed description and specific examples, such as the preferred embodiments of the present disclosure, are given by way of illustration only, since various modifications and alternations within the spirit and scope of the disclosure will be apparent to those skilled in the art. In relation to the aforementioned disclosure, design and operations of an antenna operating in a mmWave band and an electronic device controlling the same can be implemented as computer-readable codes in a program-recorded medium.

The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller of the terminal. Therefore, it should also be understood that the above-described implementations are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. An antenna module comprising a multi-layered substrate, the antenna module comprising:
 a first radiator disposed at a first region of the multi-layered substrate and forming a first conductive layer to radiate a first wireless signal as a first patch antenna of the antenna module;
 a second radiator disposed at a second region of the multi-layered substrate lower than the first region and offset from a center of the first radiator, wherein the second radiator forms a second conductive layer to radiate a second wireless signal as a second patch antenna of the antenna module; and
 a feed line connected to the second radiator through a signal via, wherein the signal via is connected to the second radiator at a connection point offset from a center of the second radiator,
 wherein positions of the first radiator and the second radiator overlap each other along one axis, wherein a length (a) of the first radiator along the one axis and a length (b) of the second radiator along the one axis are different such that the first radiator and the second radiator operate at different frequency bands, wherein a ratio (b/a) of the length of the second radiator to a length of the first radiator is in a range of 0.35 to 0.9, and wherein a ratio (c/b) of a length (c) of overlap between the first and second radiators to the length of the second radiator is less than 0.7.

2. The antenna module of claim 1, further comprising a slot region defined at a ground layer and a first pad of a plurality of pads of the signal via disposed on a same layer as the ground layer, wherein the signal via is vertically connected to the feed line beneath the ground layer through the slot region.

3. The antenna module of claim 2, further comprising a second lower conductive layer disposed on a same layer as the feed line and spaced apart from ends of the feed line, wherein one end of the second lower conductive layer spaced apart from an end of the feed line is positioned below the second radiator.

4. The antenna module of claim 2, further comprising a ground via wall comprising a plurality of pads disposed at an upper portion of the ground layer, wherein the ground via wall includes a first ground via wall and a second ground via wall disposed at opposite sides of the multi-layered substrate.

5. The antenna module of claim 4, wherein a distance (g) from the connection point of the feed line to the second ground via wall is less than or equal to 0.25 times of a wavelength corresponding to an operating frequency of an antenna element by the first and second patch antennas.

6. The antenna module of claim 1, further comprising a third lower conductive layer disposed beneath the feed line and adjacent to a third slot region at a region below the second radiator, and wherein a length of the third slot region along the one axis is longer than a length of each of a plurality of pads of the signal via along the one axis.

7. The antenna module of claim 1, wherein a ratio (d/b) of a length (d) from one end portion of the second radiator to the connection point of the feed line, to the length of the second radiator is in a range of 0.5 to 1.

8. An electronic device having an antenna module, the electronic device comprising:
a transceiver circuit disposed on the antenna module configured as a multi-layered substrate;
a main printed circuit board (PCB) disposed inside the electronic device and operably coupled to the multi-layered substrate; and
an antenna module comprising:
a first radiator disposed at a first region of the multi-layered substrate and forming a first conductive layer to radiate a first wireless signal as a first patch antenna of the antenna module;
a second radiator disposed at a second region of the multi-layered substrate lower than the first region and offset from a center of the first radiator, wherein the second radiator forms a second conductive layer to radiate a second wireless signal as a second patch antenna of the antenna module; and
a feed line connected to the second radiator through a signal via, wherein the signal via is connected to the second radiator at a connection point offset from a center of the second radiator, wherein a ratio (b/a) of a length (b) of the second radiator along one axis to a length (a) of the first radiator along the one axis is in a range of 0.35 to 0.9, and wherein a ratio (c/b) of a length (c) of overlap between the first and second radiators to the length of the second radiator is less than 0.7.

9. The electronic device of claim 8,
wherein the length of the first radiator along the one axis and the length of the second radiator along the one axis are different from each other, such that the first radiator and the second radiator operate at different frequency bands.

10. The electronic device of claim 8, further comprising a slot region defined at a ground layer and a first pad of a plurality of pads of the signal via disposed on a same layer as the ground layer, wherein the signal via is vertically connected to the feed line beneath the ground layer through the slot region.

11. The electronic device of claim 10, wherein the antenna module further comprises a ground via wall comprising a plurality of pads disposed at an upper portion of the ground layer, and wherein the ground via wall includes a first ground via wall and a second ground via wall disposed at opposite sides of the multi-layered substrate.

12. The electronic device of claim 10, wherein the antenna module is one of a plurality of antenna modules of an array antenna of the electronic device, and
the electronic device further comprises a processor disposed on the main PCB and configured to control the transceiver circuit such that the array antenna radiates a wireless signal to another electronic device.

13. The electronic device of claim 12, wherein the processor is configured to:
control the transceiver circuit to perform wireless communication using a first wireless signal of a first band radiated through the first radiator of the array antenna; and
control the transceiver circuit to perform wireless communication using a second wireless signal of a second band radiated through the second radiator of the array antenna based on the first wireless signal having a quality less than or equal to a threshold value,
wherein the transceiver circuit applies the second wireless signal of the second band to the array antenna through the feed line.

14. The electronic device of claim 8, wherein the antenna module further comprises:
a second lower conductive layer disposed on a same layer as the feed line and spaced apart from ends of the feed line; and
a third lower conductive layer disposed beneath the feed line,
wherein one end of the second lower conductive layer spaced apart from an end of the feed line is positioned below the second radiator,
wherein the third lower conductive layer is adjacent to a third slot region at a region below the second radiator, and
wherein a length of the third slot region along the one axis is longer than a length of each of a plurality of pads of the signal via along the one axis.

* * * * *